(12) United States Patent
Inoue

(10) Patent No.: US 8,930,155 B2
(45) Date of Patent: Jan. 6, 2015

(54) PULSE PROCESSING DEVICE AND RADIATION MEASURING DEVICE

(75) Inventor: Tsuyoshi Inoue, Machida (JP)

(73) Assignee: Fuji Electrict Co., Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 14/234,096

(22) PCT Filed: Jun. 27, 2012

(86) PCT No.: PCT/JP2012/004173
§ 371 (c)(1),
(2), (4) Date: Jan. 21, 2014

(87) PCT Pub. No.: WO2013/073071
PCT Pub. Date: May 23, 2013

(65) Prior Publication Data
US 2014/0188418 A1   Jul. 3, 2014

(30) Foreign Application Priority Data

Nov. 15, 2011  (JP) .................... 2011-249537

(51) Int. Cl.
*G01R 13/00* (2006.01)
*G01R 29/027* (2006.01)
*G01T 1/17* (2006.01)

(52) U.S. Cl.
CPC .............. *G01R 29/027* (2013.01); *G01T 1/171* (2013.01)
USPC .............................................. 702/66; 702/79

(58) Field of Classification Search
CPC .... G01T 1/171; G01N 15/1227; G01R 19/04; G01R 29/02; G01R 29/0273; H03K 5/1532
See application file for complete search history.

(56) References Cited

U.S. PATENT DOCUMENTS

| 5,545,900 | A | 8/1996 | Bolk et al. |
| 5,742,060 | A | 4/1998 | Ashburn |

(Continued)

FOREIGN PATENT DOCUMENTS

| JP | S50-003902 B1 | 2/1975 |
| JP | S57-119275 A | 7/1982 |

(Continued)

OTHER PUBLICATIONS

Sharpless et al., Estimation of cell size from pulse shape in flow cytoflourometry, Journal of Histochemistry and Cytochemistry, vol. 24, No. 1, pp. 257-264, 1976.*

(Continued)

*Primary Examiner* — Mischita Henson
*Assistant Examiner* — Kyle R Quigley
(74) *Attorney, Agent, or Firm* — Young Basile Hanlon & MacFarlane P.C.

(57) ABSTRACT

Provided is a pulse processing device that accelerates signal processing and prevents counting loss. Provided also is a radiation measuring device in which counting loss is prevented and counting capacity is increased by installing the pulse processing device. The processing device is in a form of a pulse processing device including a pulse detection unit that outputs a linear pulse signal in response to a physical event, a high-speed AD conversion unit that converts the linear pulse signal into digital pulse data, a threshold data setting unit that outputs preset threshold data, a peak value data detection unit that compares the digital pulse data with the threshold data and outputs the maximum digital pulse data, from among the digital pulse data continuously exceeding the threshold data, as maximum peak value data, and a signal processing unit that inputs the peak value data as a pulse wave height.

6 Claims, 29 Drawing Sheets

(56) References Cited

U.S. PATENT DOCUMENTS

| | | | |
|---|---|---|---|
| 2002/0146087 A1* | 10/2002 | Izumi et al. | 376/245 |
| 2008/0103727 A1 | 5/2008 | Ota et al. | |
| 2010/0010650 A1 | 1/2010 | Ooue | |
| 2011/0147594 A1* | 6/2011 | Scoullar et al. | 250/362 |
| 2011/0246116 A1 | 10/2011 | Kamitani et al. | |
| 2012/0298875 A1* | 11/2012 | Ueno et al. | 250/362 |

FOREIGN PATENT DOCUMENTS

| | | |
|---|---|---|
| JP | S64-059084 A | 6/1989 |
| JP | H09-281158 A | 10/1997 |
| JP | H10-513550 A | 12/1998 |
| JP | H11-014569 A | 1/1999 |
| JP | 2000-074968 A | 3/2000 |
| JP | 2002-055171 A | 2/2002 |
| JP | 2002-357692 A | 12/2002 |
| JP | 2004-340707 A | 2/2004 |
| JP | 3552744 B2 | 5/2004 |
| JP | 2006-189375 A | 7/2006 |
| JP | 2007-121189 A | 5/2007 |
| JP | 2007-327902 A | 12/2007 |
| JP | 2008-089527 A | 4/2008 |
| JP | 2008-122167 A | 5/2008 |
| JP | 2008-111704 A | 9/2008 |
| JP | 4192647 B2 | 10/2008 |
| JP | 2010-020122 A | 1/2010 |
| JP | 4572536 B2 | 8/2010 |
| JP | 2011-215005 A | 10/2011 |

OTHER PUBLICATIONS

Office Action in corresponding JP Application No. 2013-510385 dated Apr. 30, 2013.
Decision to Grant corresponding JP Application No. 2013-510385 dated Sep. 17, 2013.
Office Action issued in corresponding JP Application No. 2013-214756 on Jun. 24, 2014 with English translation.
Notification of Transmittal of Translation of the International Preliminary Report on Patentability dated May 30, 2014 and English Translation of International Preliminary Report on Patentability in PCT/JP20121004173 dated May 30, 2014.

* cited by examiner

RISE　　　　FALL

RISE　　　　　　　FALL

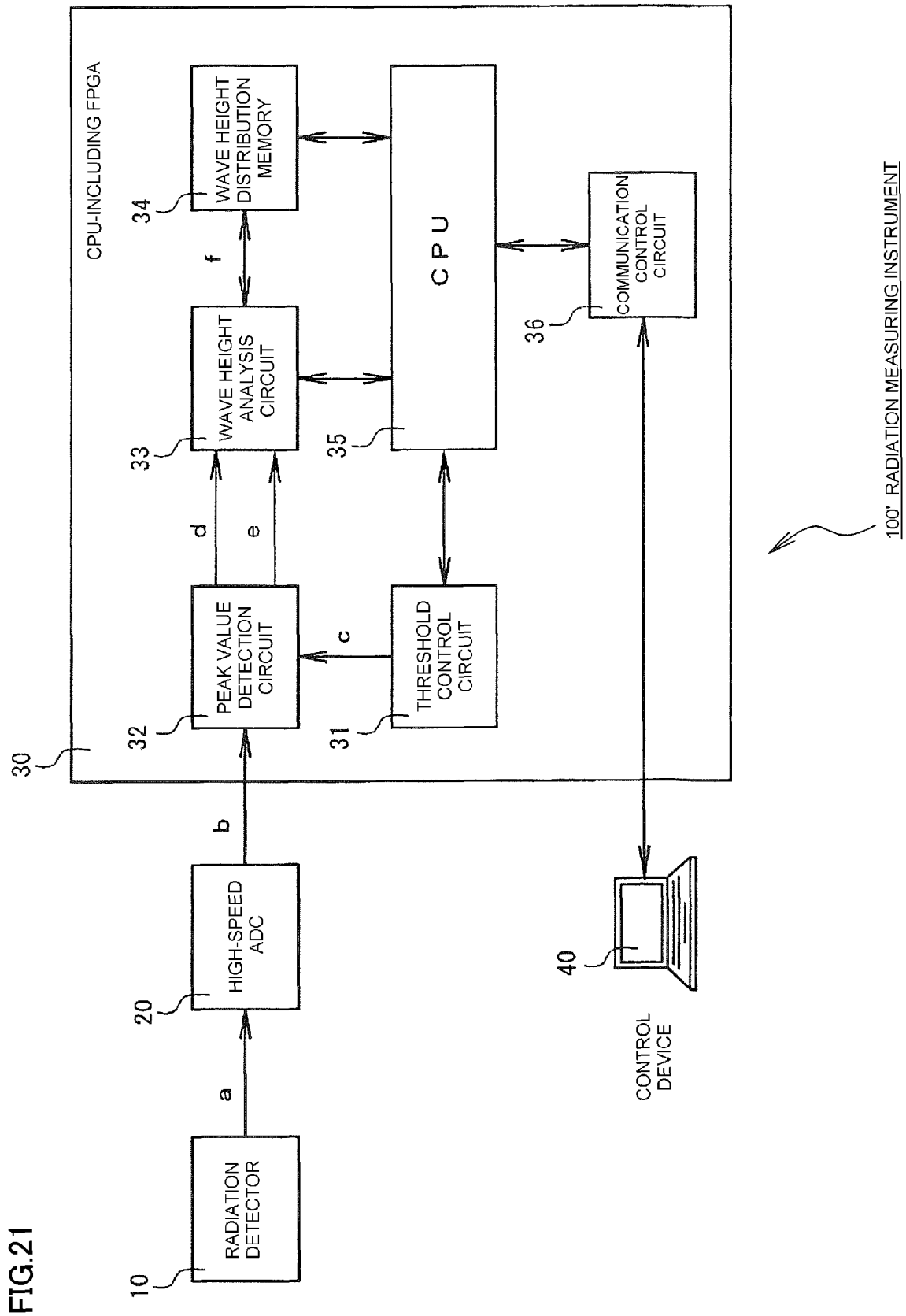

LINEAR
PULSE
SIGNAL

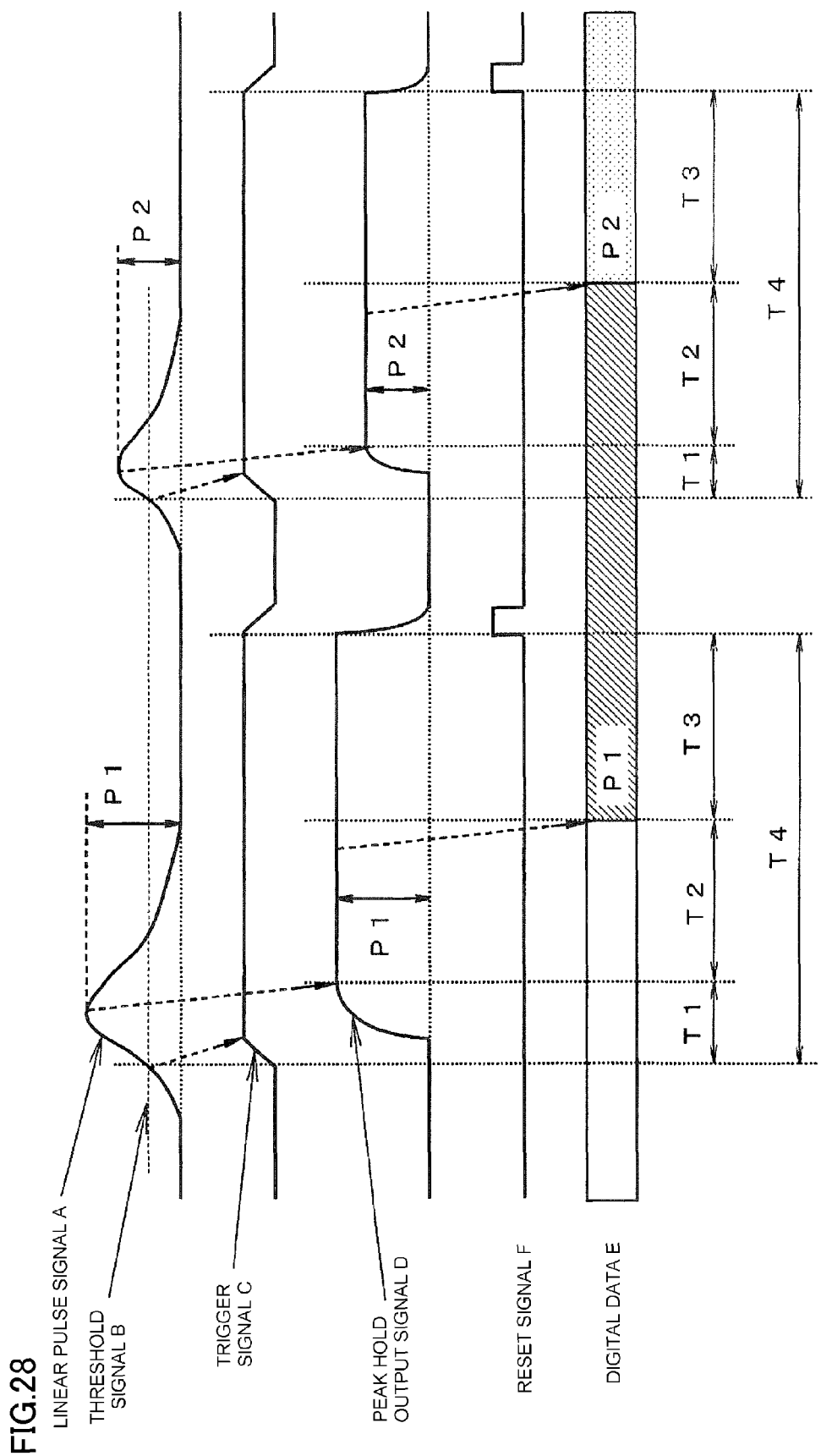

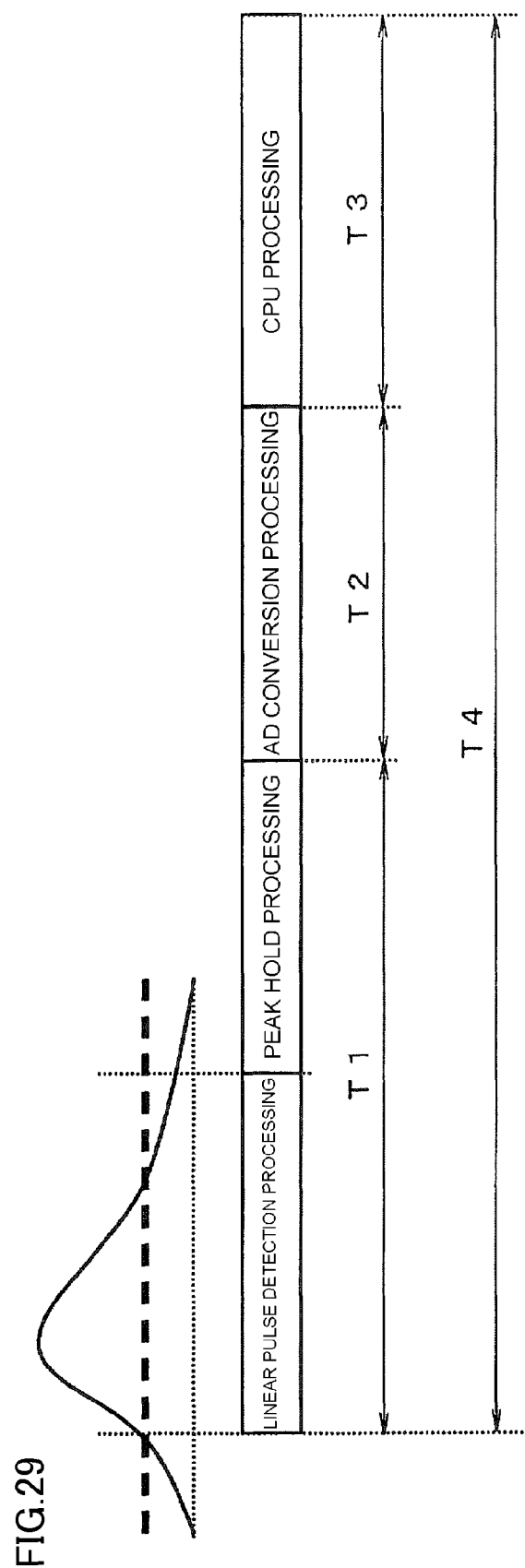

PULSE PROCESSING DEVICE AND RADIATION MEASURING DEVICE

TECHNICAL FIELD

The present invention relates to a pulse processing device that processes pulses to facilitate pulse detection and a radiation measuring device incorporating the pulse processing device.

DESCRIPTION OF THE RELATED ART

The conventional radiation measuring instrument will be explained first. As shown in FIG. 27, a conventional radiation measuring instrument 600 is provided with a radiation detector 601, a threshold control circuit 602, a comparator 603, a peak hold circuit 604, an ADC 605, and a CPU 606. The outputs from those units are shown in a time chart in FIG. 28.

The radiation detector 601 outputs a linear pulse signal A when radiation is detected. The comparator 603 inputs the linear pulse signal A from the radiation detector 601 and also inputs a threshold signal B from the threshold control circuit 602. The comparator 603 outputs a trigger signal C when the value of the linear pulse signal A exceeds the value of the threshold signal B.

The peak hold circuit 604 starts peak holding upon detecting the trigger circuit C, holds a peak at a peak value P1 of the linear pulse signal A, and outputs a peak hold output signal D held at the peak value P1. The ADC (analog-digital converter) 605 converts the peak hold output signal D into digital data and outputs digital data E representing the peak P1. The output of the digital data E representing the peak P1 is performed until new digital data E with a peak value P2 are generated.

On detecting the trigger signal C, the CPU 606 assumes a state in which the digital data from the ADC 605 can be inputted and inputs the digital data E from the ADC 605. The CPU 606 acquires the digital data E as the peak value P1. After the acquisition of the peak value P1, the CPU 606 outputs a reset signal F.

The comparator 603 inputs the reset signal F and resets the trigger signal C. The peak hold circuit 604 inputs the reset signal F and resets the peak hold output signal D. The reset signal F is thus outputted from the CPU 606, and the entire process is initialized. The peak value P2 of the other pulse is then acquired. The peak values of the inputted pulses are then similarly continuously acquired. Such radiation measuring instrument 600 counts only the linear pulse signals exceeding a predetermined wave height. The radiation measuring instrument 600 thus removes fine noise equal to or lower than a threshold, prevents erroneous detection and increases reliability.

For example, the invention described in Japanese Patent Application Publication No. 2002-55171 is known as another conventional technique in the field of such radiation measuring instruments. Such a radiation measuring instrument reduces a noise peak in a low-energy section with a bandpass filter and detects radiation. As a result, the effect of noise is reduced and the decrease in throughput caused by AD conversion is prevented.

SUMMARY OF THE DISCLOSURE

In the conventional radiation measuring instrument 600 explained with reference to FIG. 27, the next pulse detection can be performed through a period, such as T1 in FIGS. 28 and 29, in which the linear pulse detection processing and peak hold processing are performed, a period, such as T2, in which the AD conversion processing is performed, and a period, such as T3, in which the CPU processing is performed. Until a period T4, which includes the sequence of the aforementioned periods from the pulse detection to the reset elapses, the detection and processing are impossible even if the next pulse is inputted, and within the period T4, the linear pulse signals outputted from the radiation detector 601 are ignored. Thus, the problem associated with such conventional radiation measuring instrument 600 is that a dead time is caused by the processing standby interval, the detected pulses can be missed, and the counting capacity can decrease.

Further, in the radiation counting device described in Japanese Patent Application Publication No. 2002-55171, a peak detection circuit 8, a peak hold circuit 9, an A/D converter 10, and a MCA (multichannel analyzer) 11 are connected in series, as shown in FIGS. 1 and 5, and the problem associated with such a configuration is that a certain time is required for processing a single pulse, and the pulses can be missed in the same manner as in the conventional technique.

The present invention has been created to resolve the above-mentioned problems, and it is an object of the present invention to provide a pulse processing device that accelerates signal processing and prevents counting loss. It is another object to provide a radiation measuring instrument or device in which counting loss is prevented and counting capacity is increased by installing the pulse processing device.

The first aspect of the present invention resides in a pulse processing device including a pulse detection unit that outputs a linear pulse signal in response to a physical event; a high-speed AD conversion unit that converts the linear pulse signal into digital pulse data; a threshold data setting unit that outputs preset threshold data; a peak value data detection unit that compares the digital pulse data outputted by the high-speed AD conversion unit with the threshold data outputted by the threshold data setting unit, temporarily stores maximum digital pulse data, from among digital pulse data continuously exceeding the threshold data, as peak value data and outputs a peak detection signal and the maximum peak value data when the digital pulse data thereafter become less than the threshold data; and a signal processing unit that detects the peak detection signal and then inputs the peak value data as a pulse wave height.

The high-speed AD conversion unit performs the conversion processing of converting the linear pulse signals into digital pulse data at all times. The peak value data detection processing of directly taking the maximum digital pulse data thereamong as the peak value data is performed in parallel with the AD conversion processing. Various types of signal processing relating to the pulse wave height are performed by using the peak value data in parallel with the peak value data detection processing. Since the aforementioned types of processing are performed in parallel, high-speed processing can be realized.

Further, the second embodiment of the pulse processing device in accordance with the present invention includes a pulse waveform analysis unit that analyzes pulses by using the digital pulse data from the peak value data detection unit and controls the peak value data detection unit so as to output peak value data relating to a pulse that fulfills the preset condition and discard other peak value data. As a result, it is possible to obtain a wave height value from which noise has been removed.

Further, the third embodiment of the pulse processing device in accordance with the present invention includes a wave height value correction unit that generates peak value data with a corrected wave height value by using the maximum peak value data from the peak value data detection unit and preceding and following digital pulse data, and outputs the corrected peak value data to the peak value data detection unit. As a result, it is possible to obtain a wave height value from which noise has been removed.

Further, the fourth embodiment of the pulse processing device in accordance with the present invention includes a waveform shaping unit that shapes the linear pulse signal into a linear pulse signal having a smooth slope. As a result, the pulse waveform analysis is facilitated.

The fifth embodiment of the pulse processing device in accordance with the present invention includes a pulse waveform integration analysis unit that calculates an integration value of a pulse by using the digital pulse data from the peak value data detection unit, uses the integrated value to determine whether a preset condition is fulfilled, and controls the peak value data detection unit so as to output peak value data relating to a pulse that fulfills the preset condition and discard other peak value data. As a result, it is possible to obtain a wave height value from which noise has been removed.

Such pulse processing devices are particularly suitable for radiation measuring instruments. Since pulses generated by radiation can be acquired without counting loss, the wave height distribution depending on radiation is acquired with high accuracy. In particular, the nuclide identification accuracy is increased.

In accordance with the present invention, it is possible to provide a pulse processing device that accelerates signal processing and prevents counting loss. It is also possible to provide a radiation measuring instrument in which counting loss is prevented and counting capacity is increased by installing the pulse processing device.

BRIEF DESCRIPTION OF THE DRAWINGS

FIG. 9A is an explanatory drawing illustrating the usual pulse. FIG. 9B is an explanatory drawing illustrating a spiry pulse. FIG. 9C is an explanatory drawing illustrating a pulse having a plurality of peaks.

FIG. 11A is an explanatory drawing illustrating an input pulse signal. FIG. 11B is an explanatory drawing illustrating digital pulse data.

FIG. 12A is an explanatory drawing illustrating the sampling in which the maximum wave height value is obtained. FIG. 12B is an explanatory drawing illustrating the sampling in which the wave height value is shifted from the maximum value.

FIG. 13A is an explanatory drawing illustrating the case with left-right symmetry. FIG. 13B is an explanatory drawing illustrating the case with left-right asymmetry.

FIG. 16A shows the waveform before the shaping. FIG. 16B shows the waveform after the shaping.

FIG. 19A shows the usual pulse. FIG. 19B shows a small pulse. FIG. 19C shows a spiry pulse.

FIG. 20A illustrates the case in which two pulses are inputted simultaneously. FIG. 20B illustrates the case in which two pulses are inputted with an offset in time. FIG. 20C illustrates the case in which two pulses are inputted with a slight offset in time.

FIG. 21 is a block diagram of a radiation measuring instrument of Example 1.

FIG. 22A is an explanatory drawing of a linear pulse signal. FIG. 22B is an explanatory drawing of a wave height distribution.

FIG. 28 is a time chart explaining the output from each block of the conventional radiation measuring instrument.

FIG. 29 is an explanatory drawing illustrating the serial processing of the conventional radiation measuring instrument.

DETAILED DESCRIPTION OF EMBODIMENTS OF THE INVENTION

Figure 1:
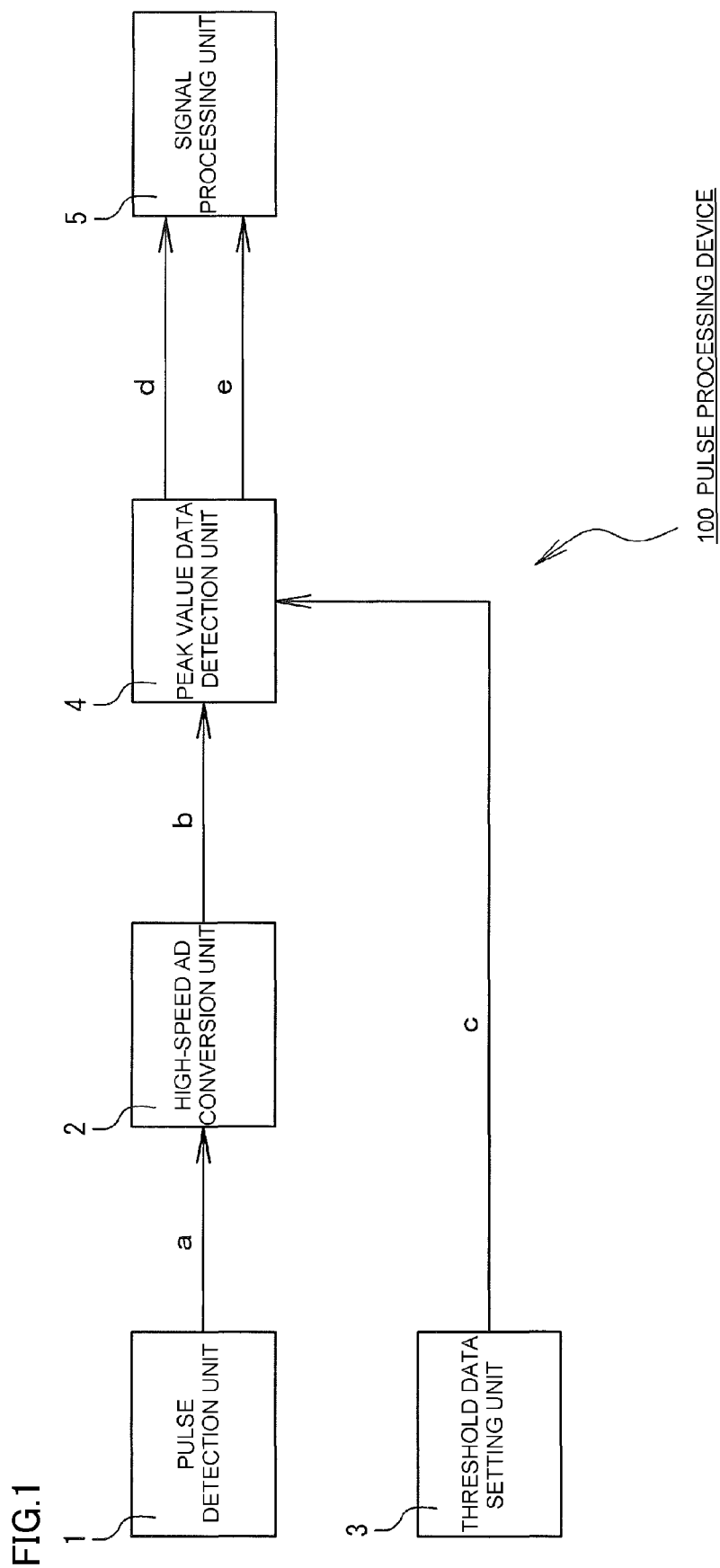
FIG. 1 is a block diagram of the pulse processing device of the first embodiment of the present invention.

The first embodiment for implementing the present invention will be described now with reference to the drawings. A pulse processing device 100 is provided, as shown in FIG. 1, with a pulse detection unit 1, a high-speed AD conversion unit 2, a threshold data setting unit 3, a peak value data detection unit 4, and a signal processing unit 5.

Figure 2:
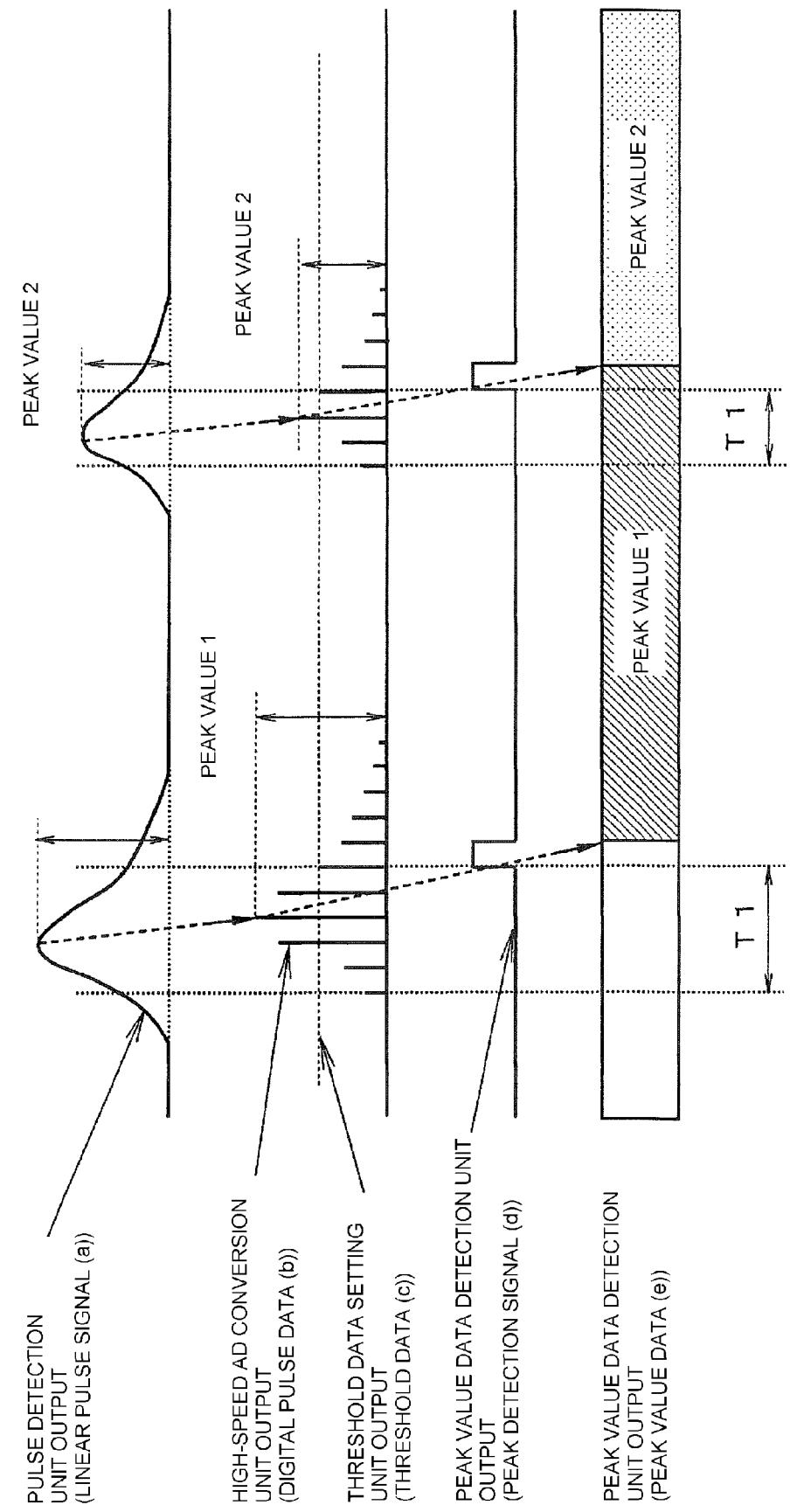
FIG. 2 is a time chart illustrating the output of various blocks of the pulse processing device of the first embodiment of the present invention.

The pulse detection unit 1 outputs a linear pulse signal (a), which is an analog signal, in response to a physical event generated at a random timing. As shown in FIG. 2, this linear pulse signal (a) has a wave height value equal to or higher than a predetermined value.

The high-speed AD conversion unit 2 samples the linear pulse signal (a) at a predetermined sampling speed, converts the sampled signal into digital pulse data (b), and sequentially outputs the digital pulse data (b). The high-speed AD conversion unit 2 has a sampling speed of 100 Msps, and a sufficient peak detection accuracy can be obtained. When another pulse is inputted within a period T1 shown in FIG. 2 from a point of time at which the sampling of the linear pulse signal (a) is started to a point of time at which the digital pulse data (b) become less than the threshold data, in other words, when the inputted linear pulses overlap, it is detected as a single pulse.

The threshold data setting unit 3 outputs threshold data (c) representing the lower limit of the preset peak value of the pulse. The threshold data (c) are a digital signal.

The peak value data detection unit 4 detects the peak value. The peak value data detection unit 4 compares the digital pulse data (b) sequentially outputted by the high-speed AD conversion unit 2 with the threshold data (c) outputted by the threshold data setting unit 3, and temporarily stores the maximum digital pulse data, from among the digital pulse data continuously exceeding the threshold data (c), as peak value data. The detection of the peak value data is performed in the following manner. First, the digital pulse data (b) exceeding the threshold data (c) are temporarily stored as the peak value data. Then, the inputted digital pulse data (b) are compared with the temporarily stored peak value data each time the digital pulse data (b) are inputted. Where the inputted digital pulse data (b) are greater than the temporarily stored peak value data, the digital pulse data (b) are updated as the peak value data and stored. Such updating of the peak value data is repeated as long as the digital pulse data (b) exceed the threshold data (c). When digital pulse data (b) thereafter become less than the threshold data (c), the peak value data detection unit 4 outputs a peak detection signal (d) and maximum peak value data (e) that are temporarily stored at this time.

The signal processing unit 5 detects the peak detection signal (d) and then inputs the peak value data (e) as a pulse wave height value. Various types of processing are then performed using the pulse wave height value.

A peak value is then acquired with respect to the next inputted linear pulse signal (a). The peak values are then sequentially acquired in the same manner. This is how the pulse processing device 100 operates.

Figure 3:
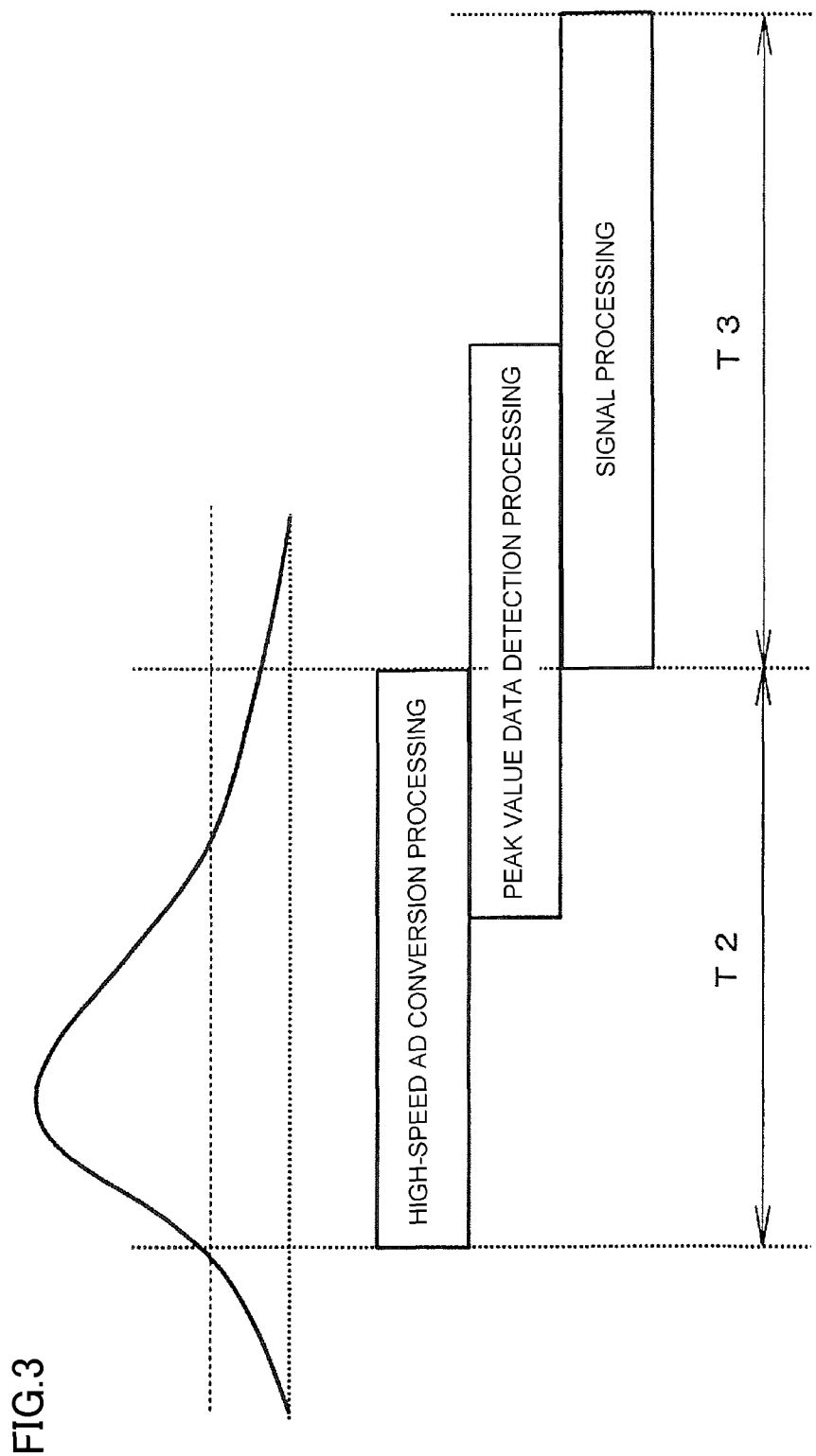
FIG. 3 is an explanatory drawing illustrating the parallel processing in the pulse processing device of the first embodiment of the present invention.

In the present embodiment, as shown in FIG. 3, the high-speed AD conversion unit 2 performs continuous uninterrupted AD conversion processing, and the peak value data detection unit 4 also advances the peak value detection processing sequentially on the basis of the digital pulse data (b) after the output of the digital pulse data (b) from the high-speed AD conversion unit 2 has been started. Therefore, parallel processing in which the processing of the high-speed AD conversion unit 2 and the processing of the peak value data detection unit 4 partially overlap, as in the period T2 shown in FIG. 3, is realized. When another pulse is inputted within the period T2, in other words, when the inputted linear pulses overlap, it is detected as a single pulse.

Further, as shown in FIG. 3, the peak value data detection unit 4 performs continuous uninterrupted processing, and the signal processing unit 5 advances the processing sequentially each time a peak value is detected after the output of the peak value data (e) from the peak value data detection unit 4 has been started. Parallel processing in which the processing of the peak value data detection unit 4 and the processing of the signal processing unit 5 partially overlap, as in the period T3, is realized.

Figure 4:
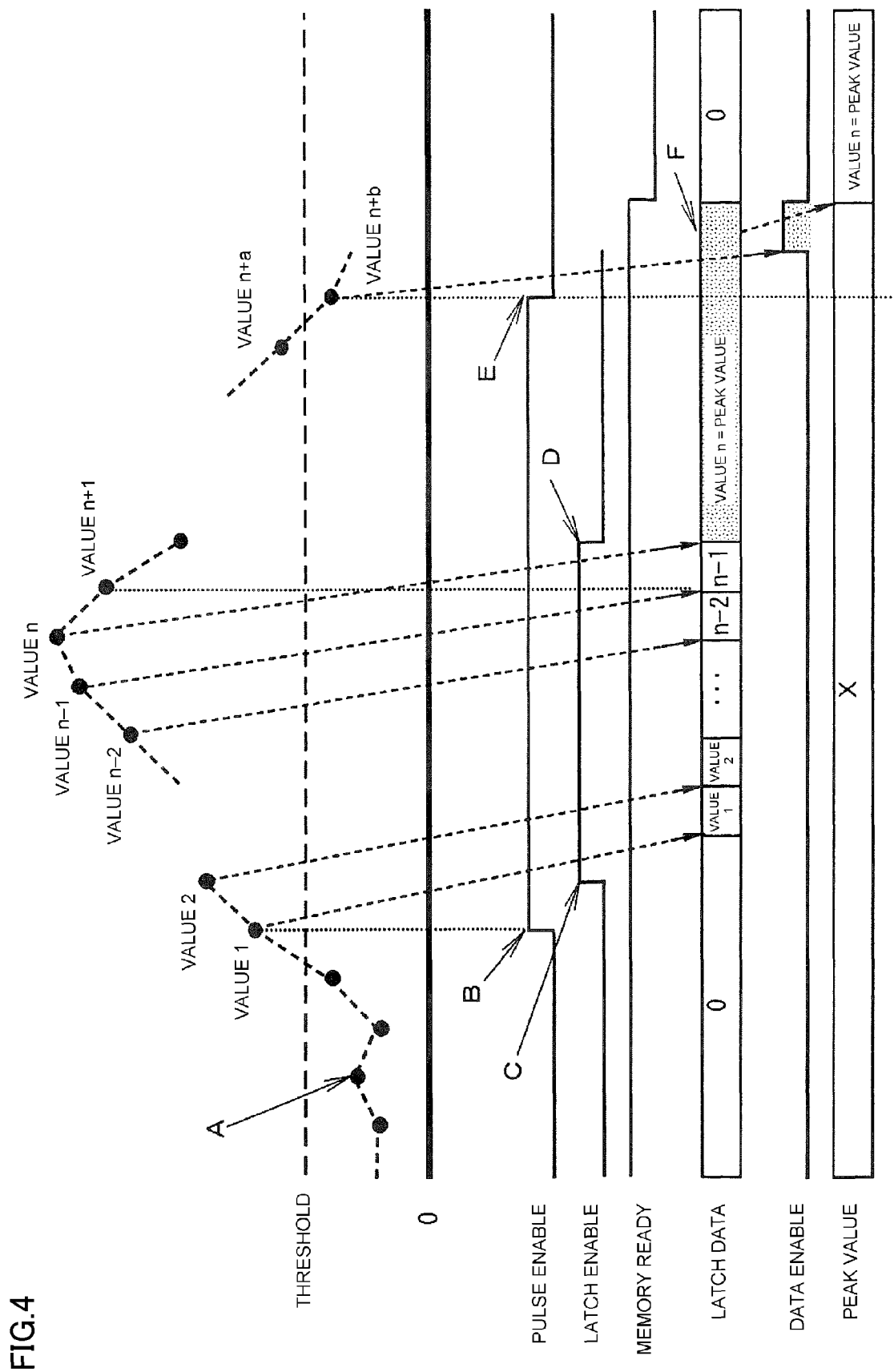
FIG. 4 is an explanatory drawing illustrating the pulse processing performed by the pulse processing device of the first embodiment of the present invention.

The pulse processing performed by the pulse processing device 100 will be explained next. First, the processing performed when a usual pulse is detected will be explained. It is assumed that the usual pulse is inputted as shown in FIG. 4. This pulse has a single peak within a range above a threshold. The range that thus continuously exceeds the threshold is recognized as a single pulse. Value 1 to value n+1, value n+a, and value n+b are the values of the digital pulse data.

A peak appears at (A), but since the peak value is less than the threshold, no detection is performed. At (B), it is detected that the threshold is exceeded and a pulse enable is set to an enabled state (asserted). At (C), it is detected that the value 1 is greater than latch data (peak value data, equal to 0 at (C)), a latch enable is asserted, and the value 1 is latched. The value 1 is a candidate of peak value data. The same operation is similarly performed till the value n is reached, and latching is performed till the value 2, ..., value n−2, value n−1, and value n are reached.

At (D), the value n+1 is less than the latch data n and, therefore, the latch enable is set to a disabled state (negated). The processing then continues to the value n+a, and the value n is held. At (E), it is detected that the value n+b became less than the threshold and the pulse enable is negated. At (F), it is detected that the values are below the threshold, the data enable is asserted, and the value n is outputted as the peak value data. The digital pulse data of the maximum value n are thus taken as the peak value data.

Figure 5:
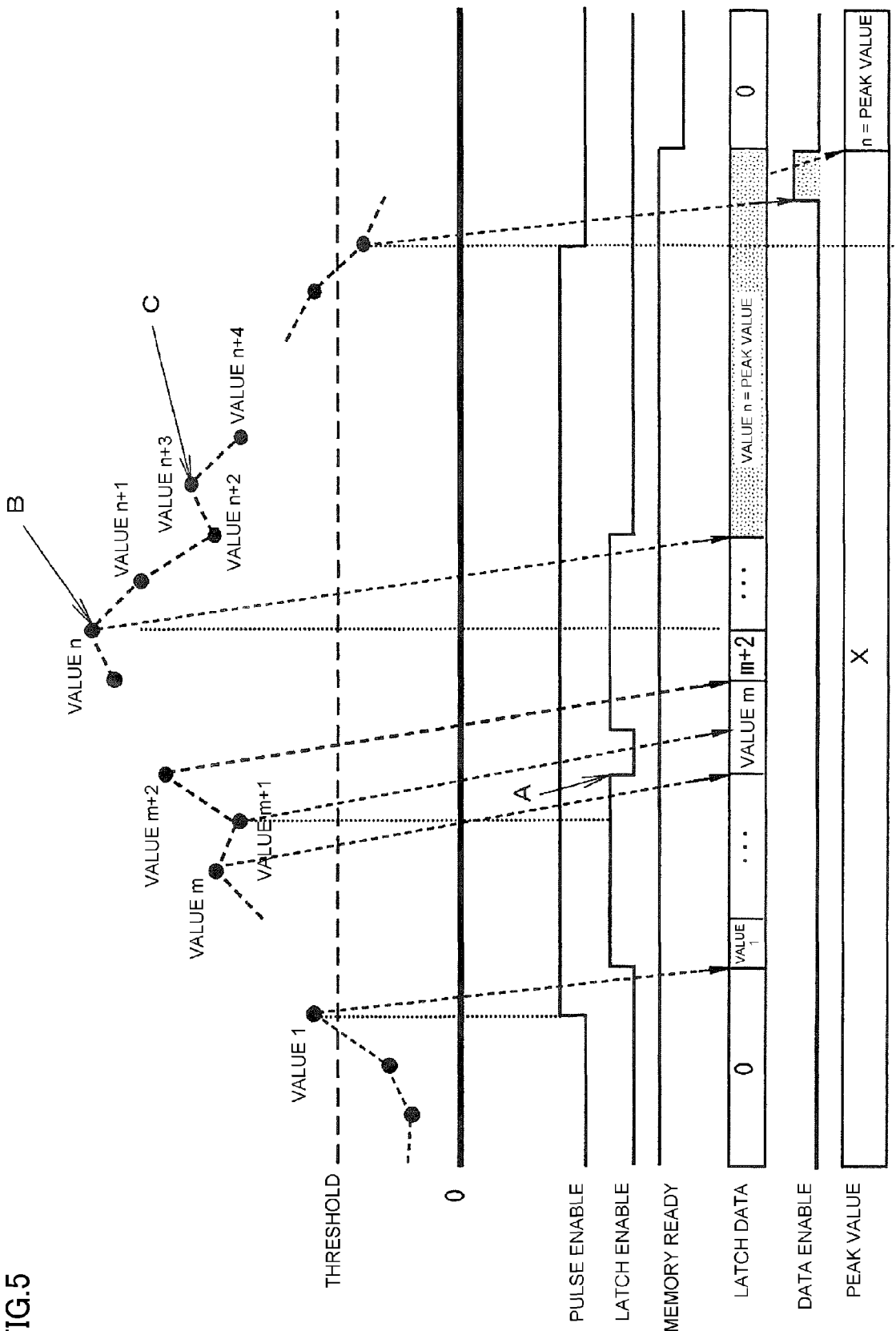
FIG. 5 is an explanatory drawing illustrating the pulse processing performed by the pulse processing device of the first embodiment of the present invention.

Another pulse processing performed by the pulse processing device 100 will be described next. This explanation relates to the detection of a pulse having a plurality of peaks. It is assumed that a pulse having a plurality of peaks in a range exceeding the threshold, as shown in FIG. 5, is inputted. The highest peak of such a pulse is detected. The value 1 to the value n+4 are the values of digital pulse data.

At (A), the value m+1 is less than latch data m and, therefore, the latch enable is negated. Since the value m+2 is larger than the value m+1, the latch enable is again asserted. The value m+1 is not latched. At (B), the maximum value n in a continuous pulse is held as a peak value. At (C), the value n+3 is less than latch data n and, therefore, not latched. Thus, the digital pulse data with the maximum value n, from among a plurality of peaks, are taken as the peak value data.

Figure 6:
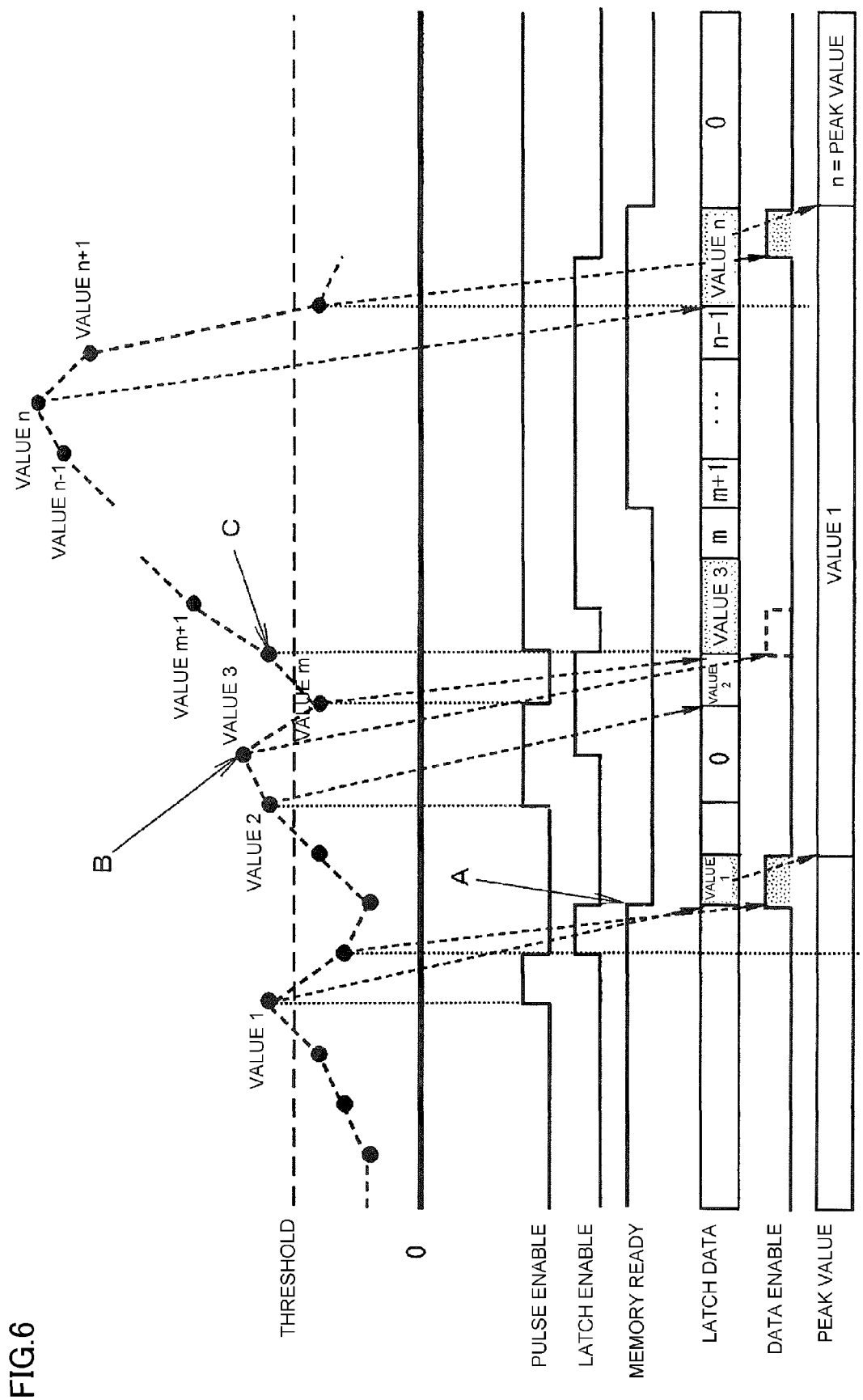
FIG. 6 is an explanatory drawing illustrating the pulse processing performed by the pulse processing device of the first embodiment of the present invention.

Another pulse processing performed by the pulse processing device 100 will be described next. This explanation relates to the detection of a very small pulse and a continuous pulse. It is assumed that a continuous pulse is inputted that includes a plurality of continuing pulses including a very small pulse such that is slightly above the threshold, as shown in FIG. 6. In this case, the peak detection is performed by taking the peaks exceeding the threshold as pulses, regardless of the pulse width. Further, even if the next peak is detected during writing to the memory, this peak is ignored. In this case, since the memory writing processing is sufficiently shorter than the pulse width, the peaks are ignored only in the case of an abnormally short interval. The memory writing time is about 100 ns. Only the highest peak is detected in such a range continuously exceeding the threshold. The value 1 to value n+1 are the values of digital pulse data.

At (A), the memory ready is negated during memory writing. The memory ready is asserted as the memory writing is completed. At (B), the peak value is detected, but since the previous memory writing has not ended, this peak value is ignored. The pulse at (C) is recognized as a new pulse which is temporarily below the threshold. Thus, digital pulse data with the maximum value n, from among a plurality of peaks, are taken as the peak value data.

Thus, the high-speed AD conversion unit 2 can perform the AD conversion of the successively inputted linear pulse signal (a), without being affected by other signals. Further, the peak value data detection unit 4 can perform peak detection on the basis of the successively inputted digital pulse data (b), without being affected by other signals. The signal processing unit 5 can perform signal processing on the basis of the successively inputted peak value data (e), without being affected by other signals. Thus, the pulse processing device 100 performs high-speed pulse processing by parallel processing, reduces the dead time caused by processing standby, and increases the counting accuracy.

Further, the threshold data setting unit 3, peak value data detection unit 4, and signal processing unit 5 are formed as an integrated semiconductor circuit by FPGA (Field-Programmable Gate Array) or the like.

As a result, the CPU is not involved in the processing of each pulse and high speed processing of pulses is realized. Further, it is possible to adapt to the output of the high-speed AD conversion unit 2, which has a rate of 100 Msps, and the increase in processing speed can be realized.

The high-speed AD conversion unit 2 increases the speed of AD conversion and no counting loss occurs with respect to the randomly inputted signals if only the pulses can be separated. As a result, the risk of counting loss is reduced and accurate counting can be realized.

Further, since the high-speed AD conversion unit 2 is used, the peak hold circuit such as used in the conventional technique becomes unnecessary. Instead, peak detection can be performed by the digital sampling system, and the processing speed is increased.

Figure 7:
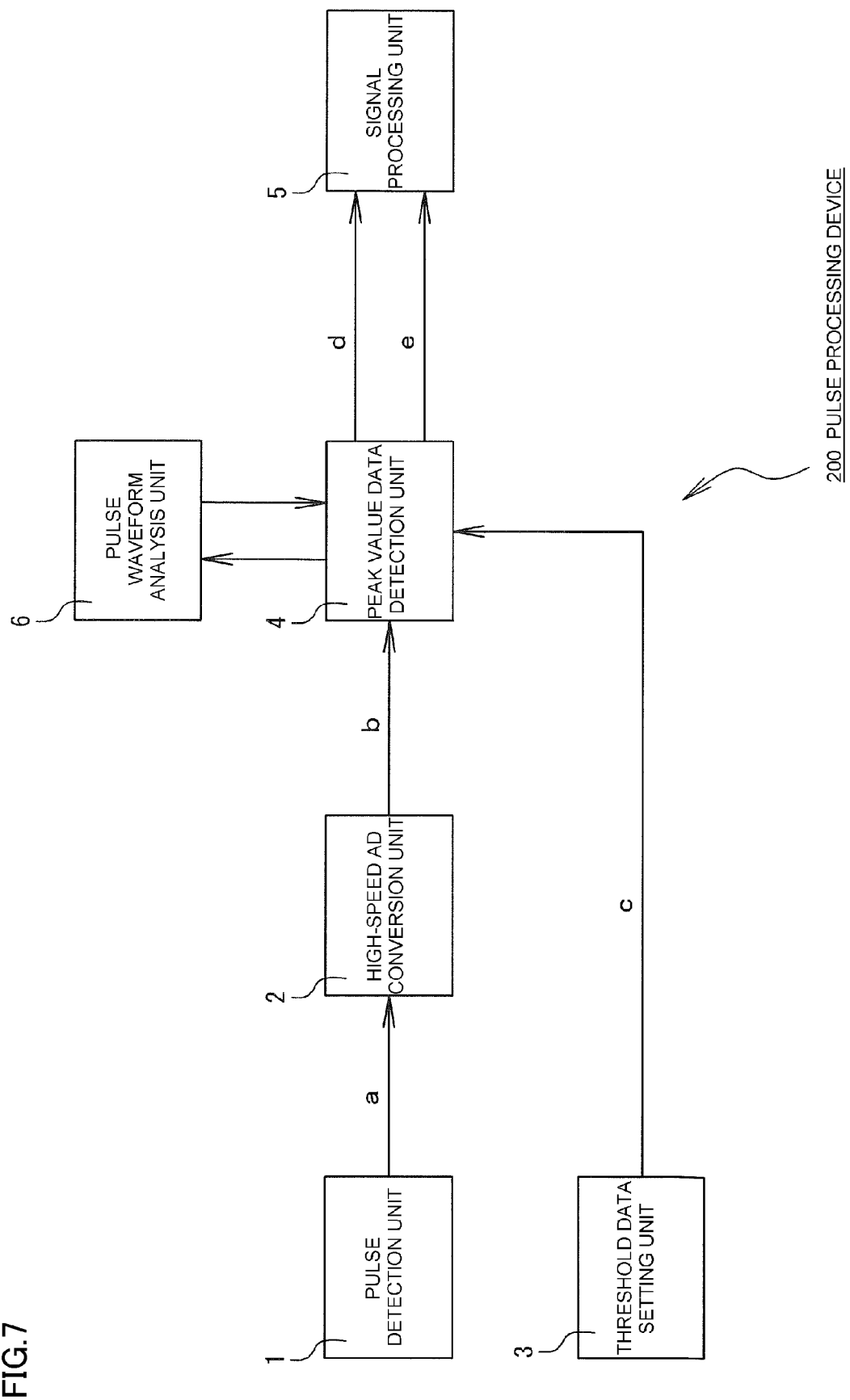
FIG. 7 is a block diagram of the pulse processing device of the second embodiment of the present invention.

The second embodiment for implementing the present invention will be described now with reference to the appended drawings. A pulse processing device 200 of this embodiment is provided, as shown in FIG. 7, with a pulse detection unit 1, a high-speed AD conversion unit 2, a threshold data setting unit 3, a peak value data detection unit 4, a signal processing unit 5, and a pulse waveform analysis unit 6.

Comparing with the first embodiment described above, the difference is that the pulse waveform analysis unit 6 is connected to the peak value data detection unit 4. The configurations of the pulse detection unit 1, high-speed AD conversion unit 2, threshold data setting unit 3, peak value data detection unit 4, and signal processing unit 5 are the same as described above and the same reference numerals are assigned thereto. Accordingly, the redundant explanation thereof is omitted. The explanation below is focused on the pulse waveform analysis unit 6.

The pulse waveform analysis unit 6 analyzes pulses by using the digital pulse data (b) from the peak value data detection unit 4 and controls the peak value data detection unit 4 so at to output peak value data relating to a pulse that fulfills a preset condition and discard other peak value data.

Figure 8:
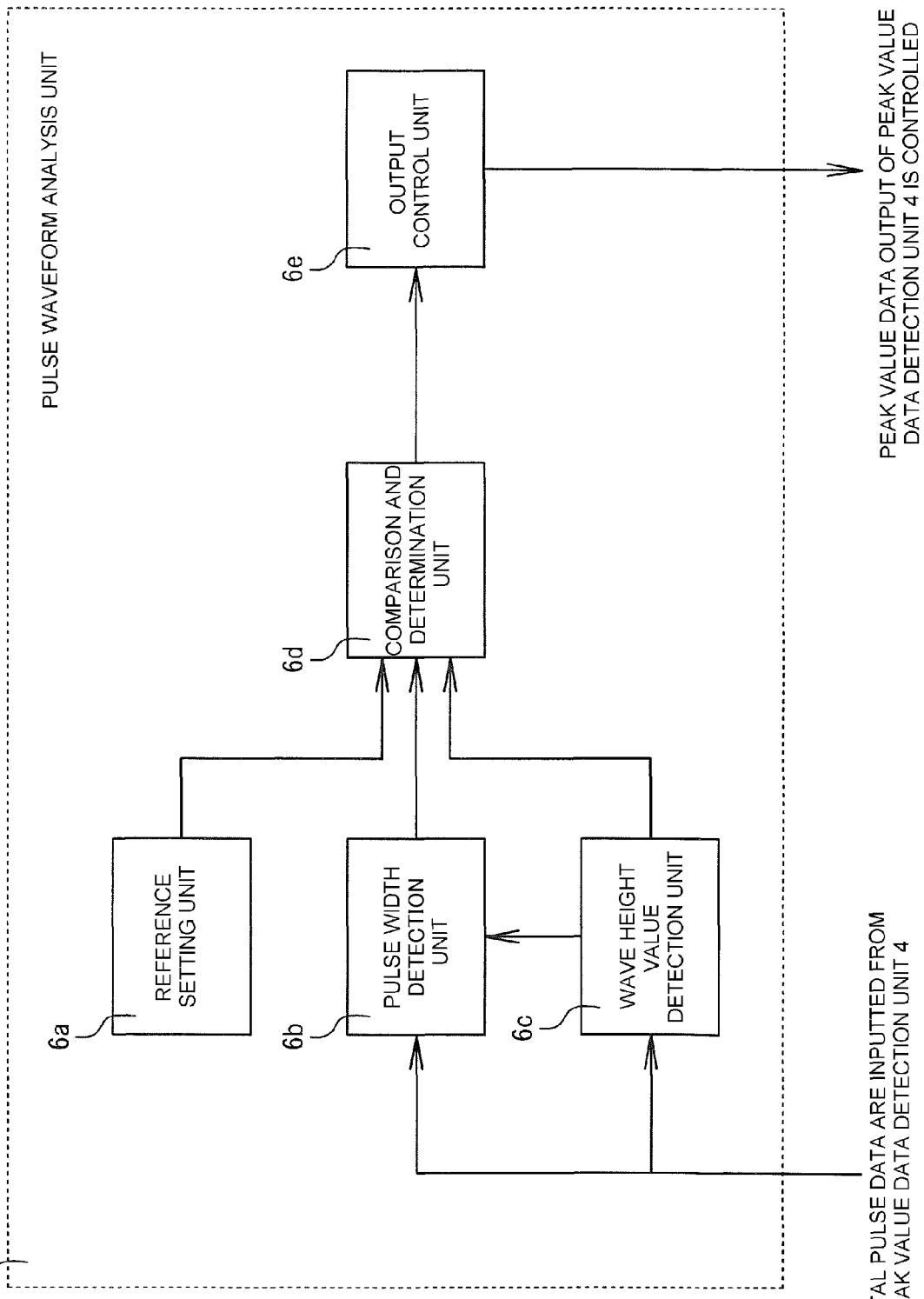
FIG. 8 is a block diagram of the pulse waveform analysis unit.

More specifically, as shown in FIG. 8, the pulse waveform analysis unit 6 is provided with a reference setting unit 6a, a pulse width detection unit 6b, a wave height value detection unit 6c, a comparison and determination unit 6d, and an output control unit 6e. Those units perform the processing of the below-described types.

Figure 9A:
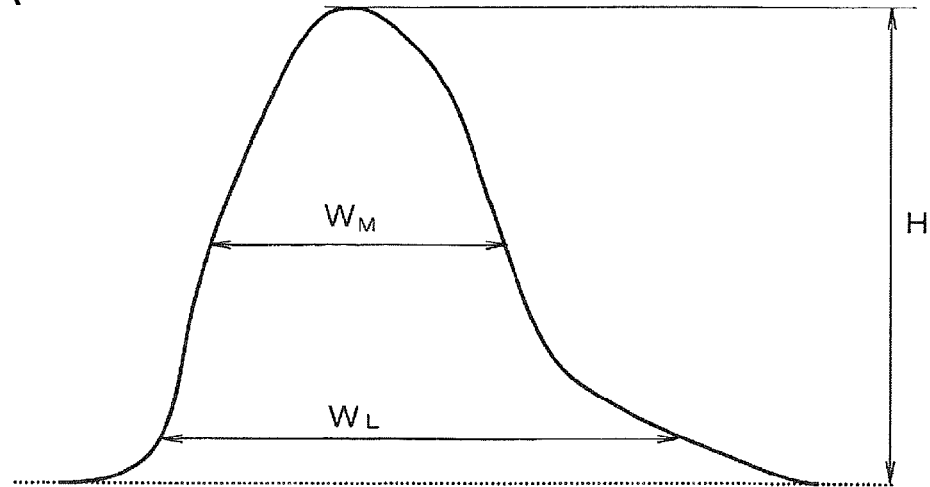
FIGS. 9A-9C are explanatory drawings illustrating the pulse waveform analysis.
Figure 9B:
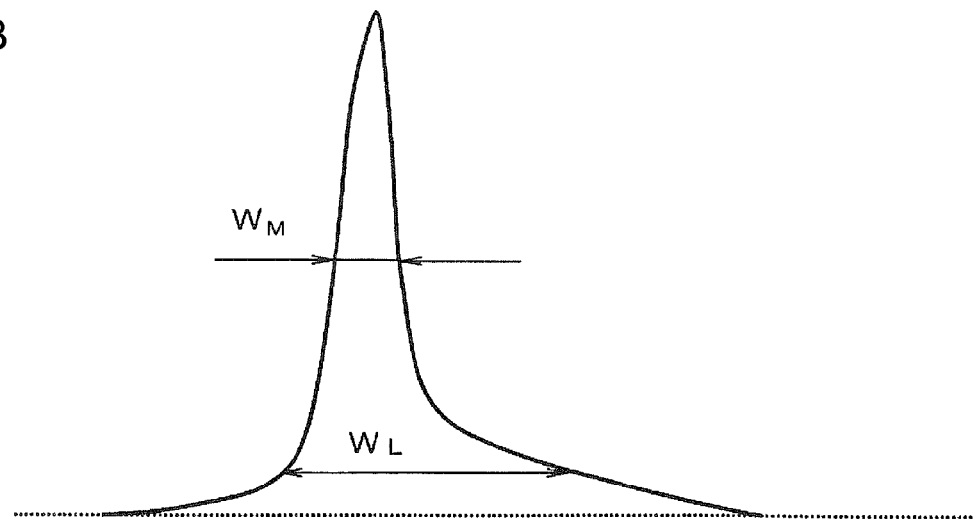
Figure 9C:
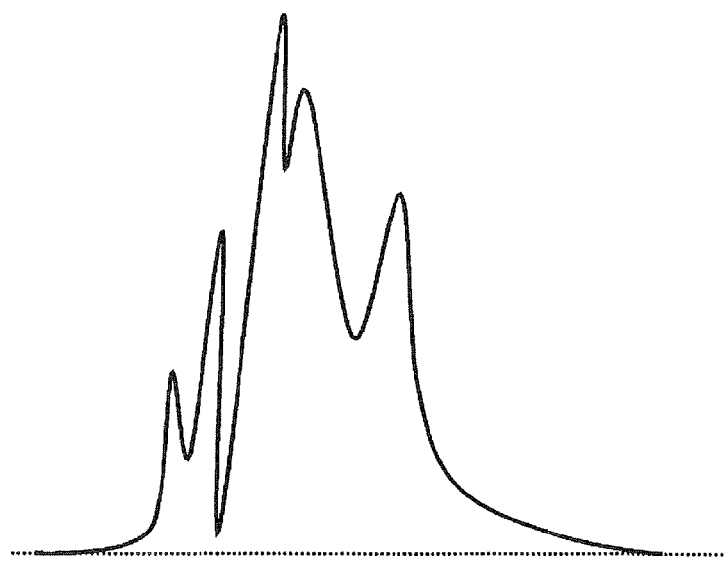

The principle of pulse analysis will be explained initially. The pulse, which is the object of processing described herein, has a substantially sine shape such as shown in FIG. 9A, a lower limit pulse width $W_L$ has a predetermined size, and a half-height pulse width $W_M$ has a predetermined size. Further, the pulse with a large wave height and a pulse with a small wave height are similar figures, and the ratio of the lower limit pulse width $W_L$ and the half-height pulse width $W_M$ is a constant, regardless of the pulse height. When the half-height pulse width $W_M$ is small as shown in FIG. 9B, the pulse appears to be spiry noise. Even when the number of peaks is large as shown in FIG. 9C, they appear as noise. The waveform analysis is performed on the basis of such specific features.

The first analysis is explained below.

The lower limit pulse width $W_L$ being longer than a predetermined length is the first condition for a normal waveform. One usual pulse obtained by detecting a physical event by high-speed AD conversion is constituted by a large number of digital pulse data. Since the digital pulse data are obtained with a predetermined sampling period, they may be represented by the number of samples. In the present embodiment, where the lower limit pulse width $W_L$ is equal to or greater than 16 samples of the reference pulse width, it is determined that the waveform is normal, and a sample less than the reference pulse width is determined as fine noise. The number of samples of the reference pulse width varies depending on the physical event that is being handled and the sampling period of the high-speed AD conversion unit 2, and the numerical value thereof can be set, as appropriate, according to the circumstances.

The units of the pulse waveform analysis unit 6 shown in FIG. 8 function in the following manner.

The reference setting unit 6a sets the predetermined reference number of digital pulse data as a reference pulse width.

The pulse width detection unit 6b inputs the digital pulse data and detects the number of digital pulse data that exceeds the predetermined lower limit value of one pulse as a lower limit pulse width.

The comparison and determination unit 6d determines that the pulse is normal when a condition that the number outputted from the pulse width detection unit 6b exceeds the reference number outputted from the reference setting unit 6a is fulfilled, and determines that the pulse is abnormal when the condition is not fulfilled. The comparison and determination unit 6d sends the determination result to the output control unit 6e.

The output control unit 6e controls the peak value data detection unit 4 so that when the pulse is normal, the peak value data of the pulse are outputted, and when the pulse is abnormal, the peak value data of the pulse are discarded.

With such waveform analysis, fine noise can be canceled.

The second analysis is explained below.

The pulses being similar figures and the ratio of the half-height pulse width $W_M$ and lower limit pulse width $W_L$ substantially being a predetermined value is the second condition for a normal waveform. When the half-height pulse width $W_M$ is abnormally small with respect to a certain lower limit pulse width $W_L$, as shown in FIG. 9B, noise is determined. In the present embodiment, the waveform is determined to be normal when the half-height pulse width $W_M$ is within a range of ¼ to ¾ of the lower limit pulse width $W_L$, and the waveform is determined to be abnormal outside this range. The aforementioned ratio varies depending on the physical event that is being handled, and the numerical value thereof can be set, as appropriate, according to the circumstances.

The units of the pulse waveform analysis unit 6 shown in FIG. 8 function in the following manner.

The reference setting unit 6a sets the predetermined upper limit value and lower limit value for a ratio. For example, the upper limit value (¼) and the lower limit value (¾) are set for the ratio obtained by dividing the half-height pulse width $W_M$ of one pulse by the reference pulse width $W_L$.

The wave height value detection unit 6c inputs digital pulse data, detects the maximum wave height value of a pulse for one pulse, and calculates the half wave height value on the basis of the maximum wave height value. The value obtained by multiplying the maximum wave height value by ½ is taken as the half wave height value.

The pulse width detection unit 6b inputs the digital pulse data, detects the number obtained by adding up two digital pulse data having the values which are the closest to the half wave height value $W_M$ outputted from the wave height value detection unit 6c and the digital pulse data sandwiched between those digital pulse data as the half-height pulse width $W_M$, and detects the number of digital pulse data exceeding the predetermined lower limit value for one pulse as the lower limit pulse width $W_L$.

The comparison and determination unit 6d determines that the pulse is normal when a condition that the ratio of the number representing the half-height pulse width $W_M$ outputted from pulse width detection unit 6b and the number representing the lower limit pulse width $W_L$ is above the lower limit value and below the upper limit value outputted from the reference setting unit 6a is fulfilled and determines that the pulse is abnormal when this condition is not fulfilled. This ratio is, for example, a value obtained by dividing the number representing half-height pulse width $W_M$ outputted from pulse width detection unit 6b by the number representing the lower limit pulse width $W_L$.

The output control unit 6e outputs the peak value data of the pulse when the pulse is normal and controls the peak value data detection unit 4 so as to discard the peak value data of this pulse when the pulse is abnormal.

With such waveform analysis, it is possible to cancel spiry noise with a narrow width and trapezoidal noise with a large width.

The third analysis is explained below.

The pulses being similar and the wave height value H and the lower limit pulse width $W_L$ increasing in the same manner when the pulse increases in size is the third condition for a normal waveform. In the present embodiment, the ratio obtained by dividing the wave height value H by the lower limit pulse width $W_L$ is set to a constant value (for example, 0.75 to 1.25). This ratio varies depending on the physical event that is being handled, and the numerical value thereof can be set, as appropriate, according to the circumstances.

The units of the pulse waveform analysis unit 6 shown in FIG. 8 function in the following manner.

The reference setting unit 6a sets the predetermined upper limit value and lower limit value for a ratio. For example, the upper limit value and lower limit value are set for the ratio obtained by dividing the wave height value H of one pulse by the reference pulse width $W_L$.

The pulse width detection unit 6b inputs the digital pulse data and detects the number of digital pulse data exceeding the predetermined lower limit value for one pulse as the lower limit pulse width.

The wave height value detection unit 6c inputs digital pulse data and detects the maximum wave height value of a pulse for one pulse.

The comparison and determination unit 6d determines that the pulse is normal when a condition that the ratio of the wave height value outputted from the wave height value detection unit 6c and the number representing the lower limit pulse width outputted from the pulse width detection unit 6b is above the lower limit value and below the upper limit value outputted from the reference setting unit 6a is fulfilled and determines that the pulse is abnormal when this condition is not fulfilled. This ratio is, for example, a value obtained by dividing the wave height value outputted from the wave height value detection unit 6c by the number representing the lower limit pulse width outputted from the pulse width detection unit 6b.

The output control unit 6e controls the peak value data detection unit 4 so that when the pulse is normal, the peak value data of the pulse are outputted, and when the pulse is abnormal, the peak value data of the pulse are discarded.

With such waveform analysis, it is possible to cancel spiry noise with a narrow width and trapezoidal noise with a large width.

The fourth analysis is explained below.

The variation ratio of a plurality of samples (for example, 8 samples) centered on the wave height value is the fourth condition for a normal waveform. Where the variations on the wave height value periphery are abnormally large, spiry noise shown in FIG. 9B or noise caused by a large number of peaks, such as shown in FIG. 9C, occurs. In the present embodiment this variation ratio is set within a constant range (for example, 0.75 to 1.25). This ratio varies depending on the physical event that is being handled, and the numerical value thereof can be set, as appropriate, according to the circumstances.

The units of the pulse waveform analysis unit 6 shown in FIG. 8 function in the following manner.

The reference setting unit 6a sets the predetermined upper limit value and lower limit value for a variation ratio. More specifically, the upper limit value and lower limit value of the variation ratio of the adjacent digital pulse data are set.

The wave height value detection unit 6c inputs digital pulse data, detects the maximum wave height value of a pulse for one pulse, and detects the variation ratio of the adjacent digital pulse data relating to a plurality of preceding and following digital pulse data sandwiched between the digital pulse data of the maximum wave height value.

The comparison and determination unit 6d determines that the pulse is normal when a condition that the variation ratio outputted from the wave height value detection unit 6c is greater than the lower limit value and less than the upper limit value outputted from the reference setting unit 6a is fulfilled, and determines that the pulse is abnormal when the condition is not fulfilled.

The output control unit 6e controls the peak value data detection unit 4 so that when the pulse is normal, the peak value data of the pulse are outputted, and when the pulse is abnormal, the peak value data of the pulse are discarded.

With such waveform analysis, it is possible to cancel spiry noise and multiple-peak noise.

The pulse processing device 200 of the present embodiment is explained above.

Figure 27:
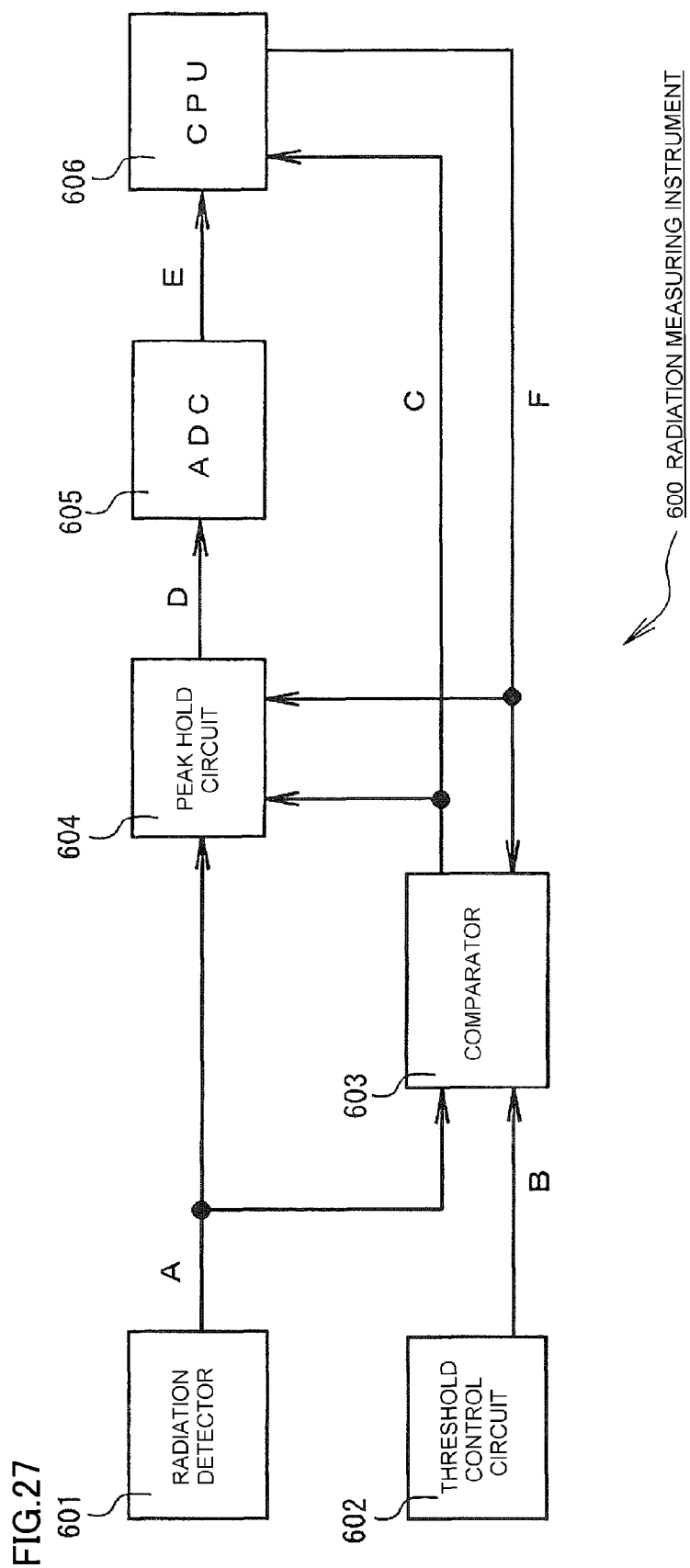
FIG. 27 is a block diagram of the conventional radiation measuring instrument.

In the peak detection processing using the conventional peak hold circuit shown in FIG. 27, only the wave height value of the pulse is obtained and the pulse shape cannot be recognized. Even when irregular pulses caused by noise or the like are inputted, the wave height analysis is performed in the same manner as with the regular pulses.

Meanwhile, in the second embodiment of the present invention, the pulse waveform analysis unit 6 is added to the peak value data detection unit 4 and the abnormal pulses are removed. Since the peak value detection is performed after digital pulse data have been obtained in the high-speed AD conversion unit 2, information indicating the pulse waveform is retained in the digital pulse data. As a result, various specific features relating to the waveform of the pulse, such as the pulse width or the inclination at a certain voltage value, can be determined. By comparison with the determination conditions established in advance, the regular pulses are recognized as such, whereas the pulses having an irregular waveform are removed as irregular pulses caused by noise or the like.

Figure 10:
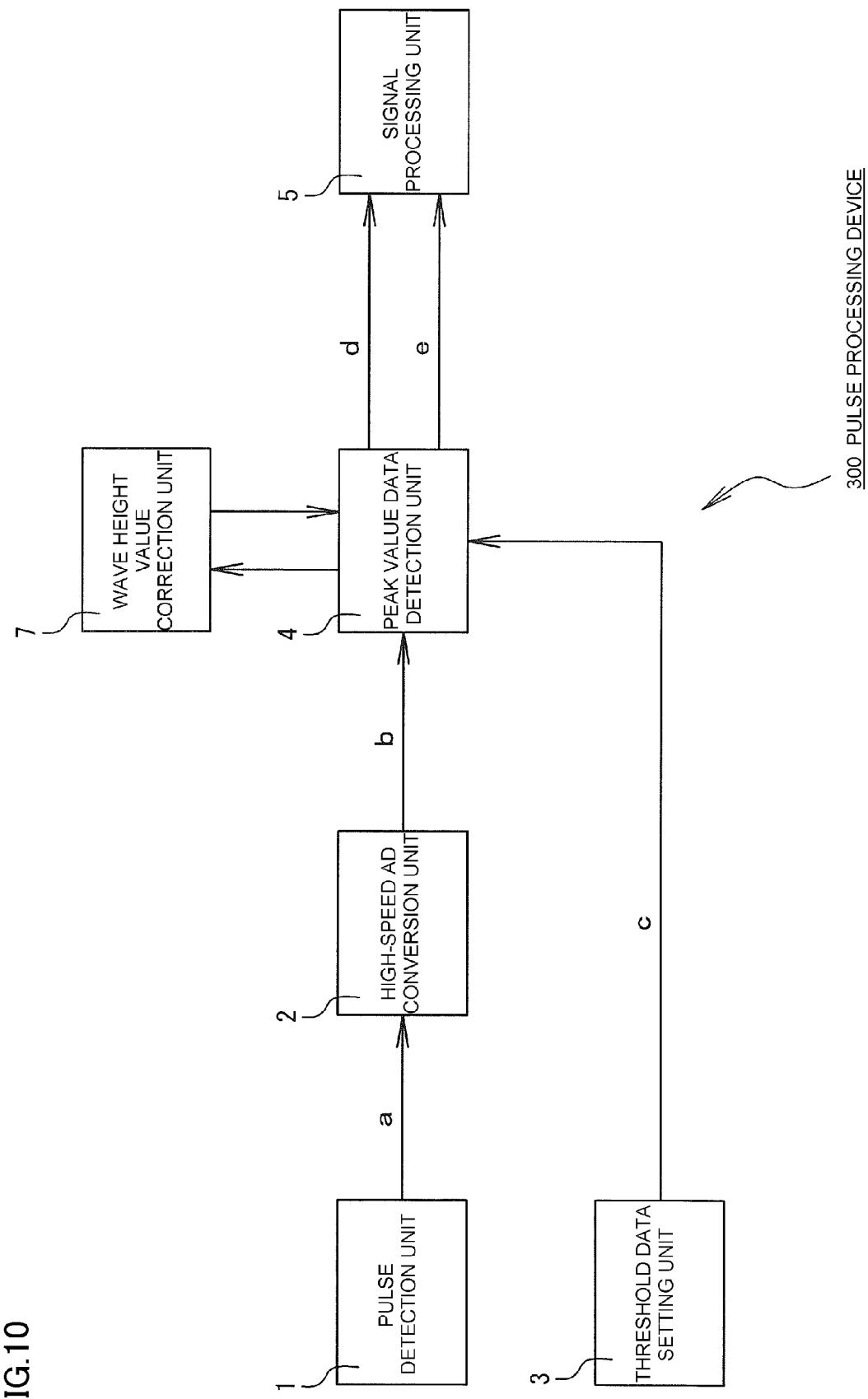
FIG. 10 is a block diagram of the pulse processing device of the third embodiment of the present invention.

The third embodiment for implementing the present invention will be explained now with reference to the appended drawings. As shown in FIG. 10, a pulse processing device 300 includes a pulse detection unit 1, a high-speed AD conversion unit 2, a threshold data setting unit 3, a peak value data detection unit 4, a signal processing unit 5, and a wave height value correction unit 7.

When analog pulses are AD converted and peak detection is performed by digital processing, an error is generated in the actual wave height value due to high-frequency noise superimposed on the pulses or because of the deviation of sampling timing. Accordingly, the wave height value correction unit 7 is added that performs digital correction on the basis of the digital pulse data preceding and following the peak value data with respect to the peak value data representing the maximum wave height value obtained with the peak value data detection unit 4.

Comparing with the above-described first embodiment, the wave height value correction unit 7 is connected to the peak value data detection unit 4. The pulse detection unit 1, high-speed AD conversion unit 2, threshold data setting unit 3, peak value data detection unit 4, and signal processing unit 5 are configured in the same manner as described above and assigned with the same reference numerals. The redundant explanation thereof is herein omitted. The explanation below is focused on the wave height value correction unit 7.

The wave height value correction unit 7 generates peak value data obtained by correcting the wave height value by using the maximum peak value data from the peak value data detection unit 4 and the preceding and following digital pulse data, and outputs the corrected peak value data to the peak value data detection unit 4.

The correction principle will be explained below.

Figure 11A:
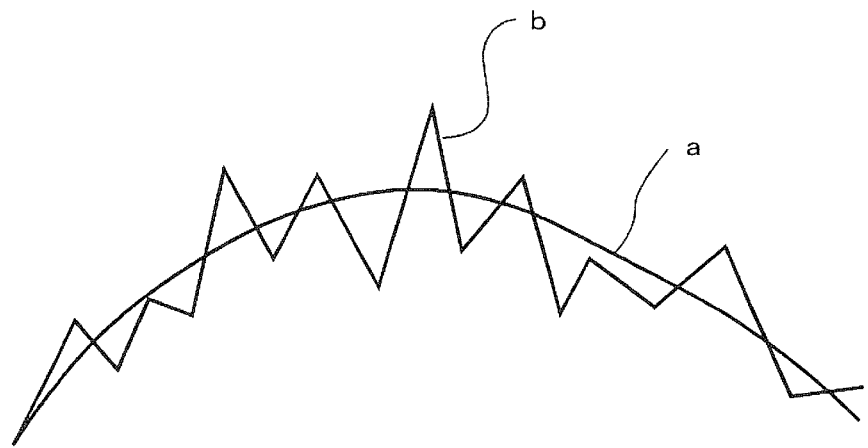
FIGS. 11A and 11B are explanatory drawings illustrating the wave height value correction.
Figure 11B:
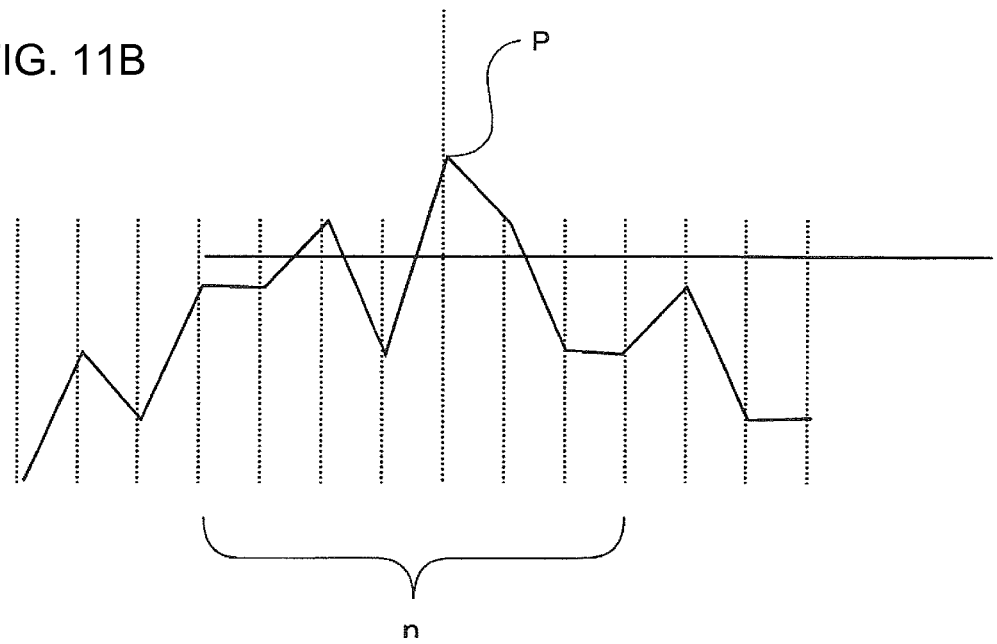

The first correction by which high-frequency noise is removed will be initially explained. It is preferred that the waveform be a smooth ideal waveform such as the waveform (a) shown in FIG. 11A. However, the waveform is usually the waveform (b) in which noise is superimposed on the ideal waveform (a). Accordingly, as shown in FIG. 11B, a more accurate wave height value is obtained by taking an average value of 8 data before and 8 data after the data of the peak value P (in other words, a total of 16 preceding and following data) as the corrected wave height value. Such correction is particularly advantageous from the standpoint of reducing high-frequency notice.

Figure 12A:
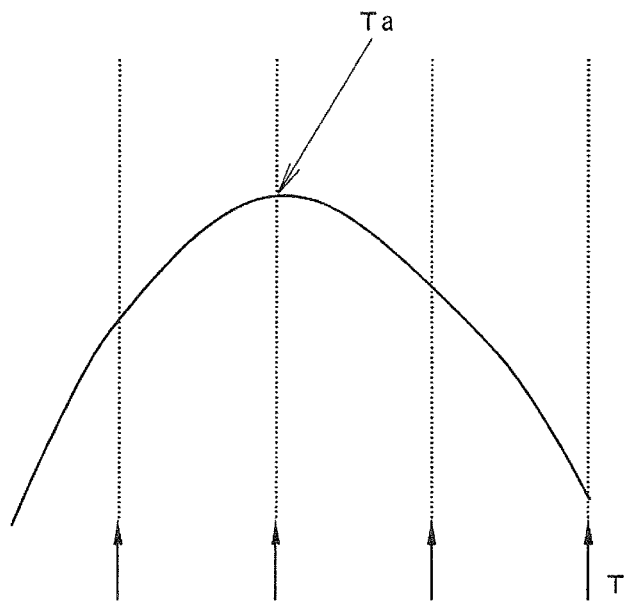
FIGS. 12A and 12B are explanatory drawings illustrating the wave height value correction.
Figure 12B:
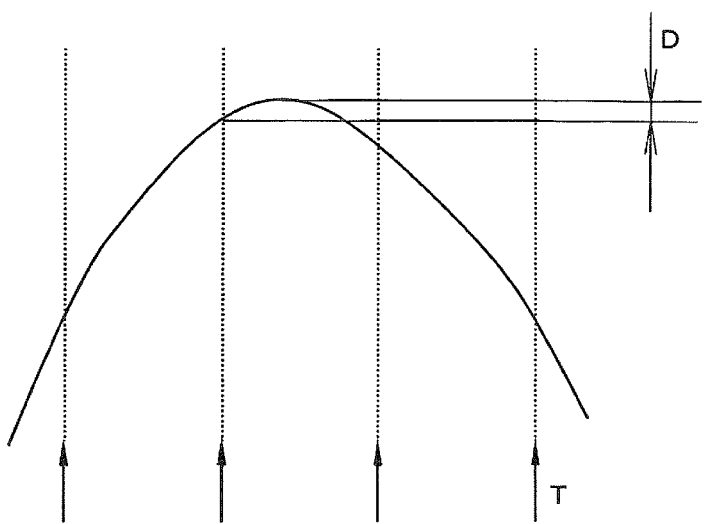

Explained next is the second correction in which the shift from the true peak value caused by the sampling timing is corrected. FIG. 12A illustrates the sampling in which an accurate wave height value is obtained. The maximum wave height is sampled at a sampling timing Ta, the true wave height value is approximately equal to the detected wave height value, and the correct wave height value is obtained. However, where the sampling is performed at a position shifted from the maximum wave height of the pulse at the sampling timing, as shown in FIG. 12B, the wave height value shifts, and the true wave height value is not equal to the detected wave height value. Therefore, it is necessary to correct the displacement D from the true peak value.

First, the correction will be explained that is performed in the case where the true peak value is left-right symmetrical with respect to the center, that is, in the case where the rise time is equal to the fall time.

Figure 13A:
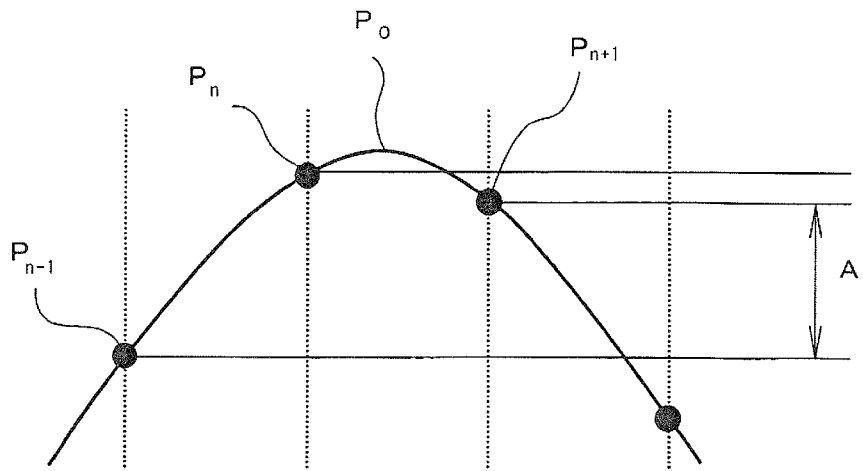
FIGS. 13A and 13B are explanatory drawings illustrating the wave height value correction.

Whether or not the true peak value is left-right symmetrical with respect to the center is determined, as shown in FIG. 13A, on the basis of whether or not the digital pulse data are symmetrical with respect to the peak value as a boundary. For example, a difference is found between the digital pulse data before the n-th sample and the digital pulse data after the n-th pulse, with the peak value taken as the center, and where this difference is close to zero, the digital pulse data are determined to be left-right symmetrical.

The correction is then performed. The difference A between the values $P_{n-1}$ and $P_{n+1}$ before and after the peak value is calculated. Where one wave height value is large and the other wave height value is small and the difference therebetween is large, as shown in FIG. 13A, the difference between the peak value and the true wave height value is determined to be large. In such a case, the true wave height value is calculated in the following matter.

The true wave height value $P_0$ is calculated by adding a value obtained by multiplying the difference A between the values $P_{n-1}$ and $P_{n+1}$ before and after the peak value by 1/x to the peak value $P_n$, as indicated by the following Eq. 1.

$$\text{True wave height value } P_0 = P_n + A/x \qquad [\text{Eq. 1}]$$

The value of x is an adjustable parameter affected by the physical event or the sampling frequency of the high-speed AD conversion device and can be set as appropriate.

The case in which the pulse rises rapidly and falls slowly will be explained below.

Figure 13B:
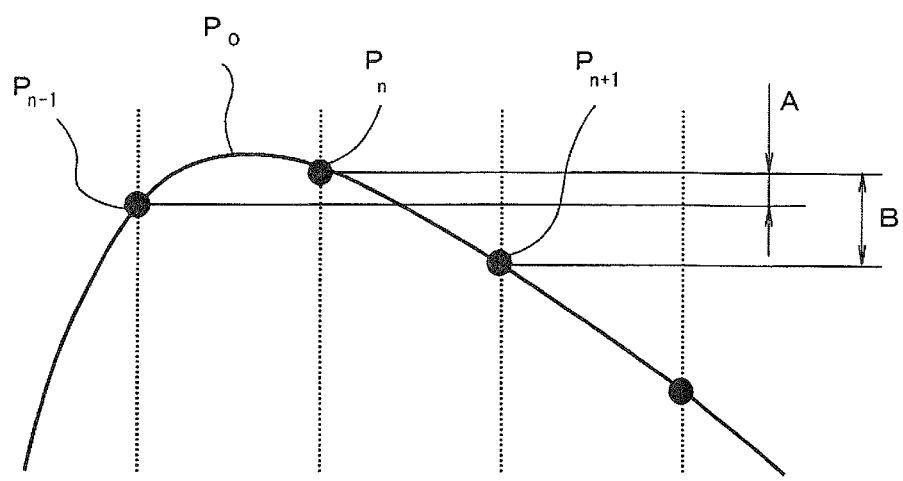

As for a method for determining whether or not the pulse rises rapidly and falls slowly, for example, as shown in FIG. 13B, it is determined that the pulse rises rapidly and falls slowly when the variation rate caused by the digital pulse data before the n-th sample is large and the variation rate caused by the digital pulse data after the n-th sample is small, where the peak value is taken as the center.

In such a case, the shape, which is left-right symmetrical with respect to the true peak value as the center, is obtained. Accordingly, the true wave height value is obtained as shown in Eq. 2 below by calculating the difference A between the peak value $P_n$ and the preceding value $P_{n-1}$ and a value obtained by multiplying the difference B between the peak value $P_n$ and the following value $P_{n+1}$ by x, multiplying the difference between those A and B·x by 1/y, and adding the product to the peak value $P_n$.

$$\text{True wave height value } P_0 = P_n + |(A - B \cdot x)|/y \qquad [\text{Eq. 2}]$$

The values of x and y are adjustable parameters affected by the physical event or the sampling frequency of the high-speed AD conversion device and can be set as appropriate.

In the case in which the pulse rises slowly and falls rapidly, the correction is performed in the same manner. The correction can be also performed in the case without the left-right symmetry.

The correction can be also performed by combining the first correction with the second correction. Thus, initially the first correction is performed by which the ideal waveform is obtained by removing high-frequency noise and then the second correction, which is the correction performed in the case of left-right symmetry with respect to the true peak value as the center or the correction performed in the case of left-right asymmetry with respect to the true peak value as the center, is performed, thereby making it possible to perform more accurate correction. Such peak value data are outputted to the peak value data detection unit 4. The peak value data detection unit 4 temporarily stores the corrected peak value data and outputs the data at an appropriate timing. In the present embodiment, the peak value data are corrected by the wave height value correction unit 7 at all times. Therefore, the peak value data detection unit 4 outputs the peak value data with a delay in time.

In the third embodiment of the present invention the wave height value correction unit 7 is added to the peak value data detection unit 4 to obtain an accurate wave height value. The error caused by high-frequency noise is reduced by determining the average value of the values preceding and following the detected peak value. Further, the error caused by the shift in the sampling timing is reduced by calculating the true value of wave height from the values preceding and following the detected peak value. In addition, the errors caused by both factors are reduced simultaneously by combining the average value with the calculation of the true value of wave height. As a result, the wave height analysis can be performed with high accuracy.

Figure 14:
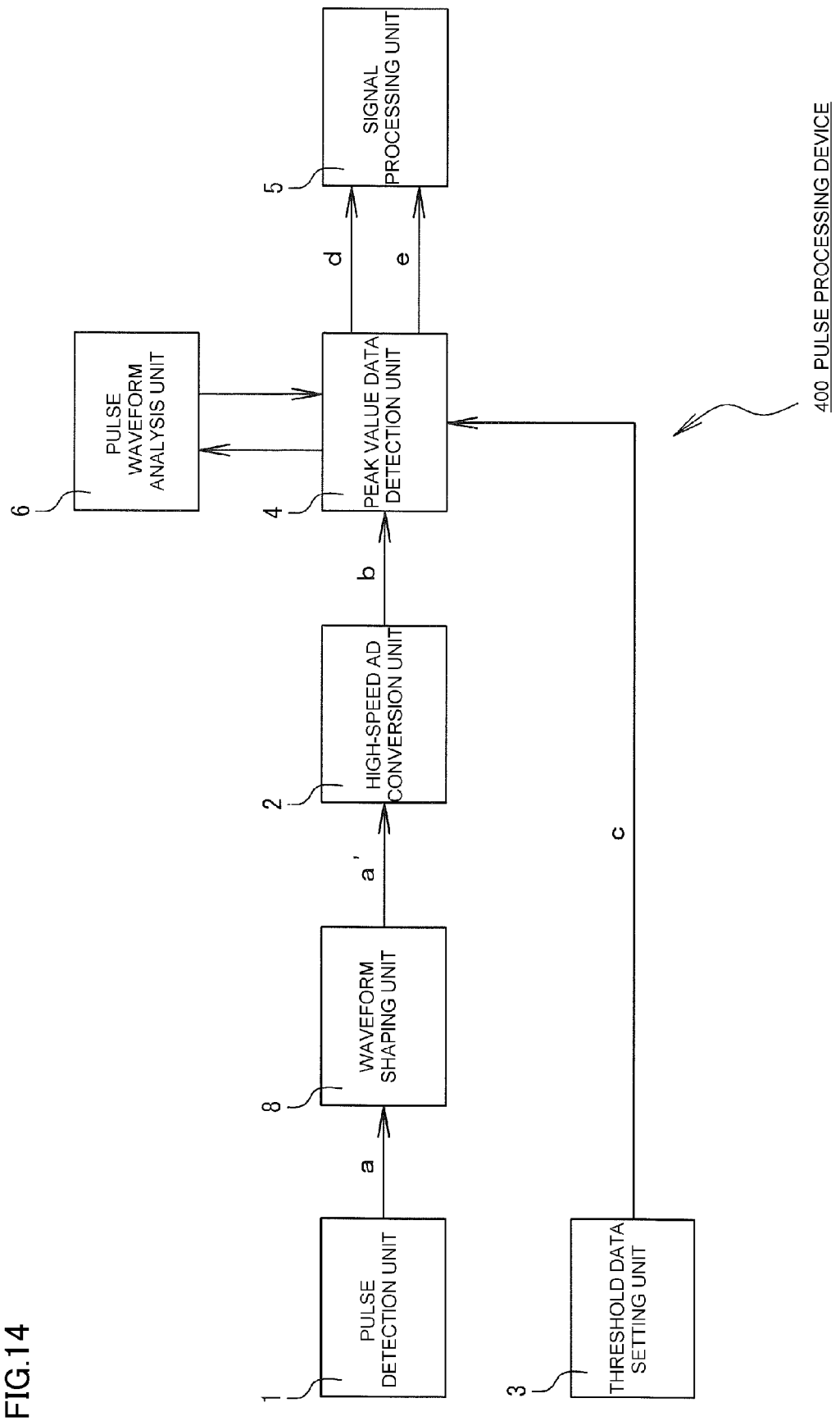
FIG. 14 is a block diagram of the pulse processing device of the fourth embodiment of the present invention.

The fourth embodiment for implementing the present invention will be explained now with reference to the appended drawings. As shown in FIG. 14, a pulse processing device 400 includes a pulse detection unit 1, a high-speed AD conversion unit 2, a threshold data setting unit 3, a peak value data detection unit 4, a signal processing unit 5, a pulse waveform analysis unit 6, and a waveform shaping unit 8.

In the linear pulse signal (a) outputted from the pulse detection unit 1, the peak vicinity is steep and accurate peak value detection can be difficult. Further, when there is no significant difference in specific features between a normal pulse and an abnormal pulse when the pulse waveform analysis is performed with the pulse waveform analysis unit 6, pulses are difficult to discriminate by the pulse waveform analysis. In the peak value data detection unit 4, a highly accurate peak value is also difficult to obtain for certain waveforms. Accordingly, the waveform shaping unit 8 is added to the front stage of the high-speed AD conversion unit 2. As a result, the waveform of the linear pulse signal (a) is shaped to be adapted for high-speed AD conversion, the recognition of the normal pulse with the high-speed AD conversion unit 2 is facilitated and the analysis with the waveform analysis unit 6 can be performed with high accuracy.

Comparing with the preceding second embodiment, the difference is that the waveform shaping unit 8 is inserted between the pulse detection unit 1 and the high-speed AD conversion unit 2 and the pulse waveform is corrected using the linear pulse signal (a) outputted from the pulse detection unit 1. The pulse detection unit 1, high-speed AD conversion unit 2, threshold data setting unit 3, peak value data detection unit 4, signal processing unit 5, and pulse waveform analysis unit 6 are configured in the same manner as described above and assigned with the same reference numerals. The redundant explanation thereof is herein omitted. The explanation herein is focused on the waveform shaping unit 8.

Figure 16A:
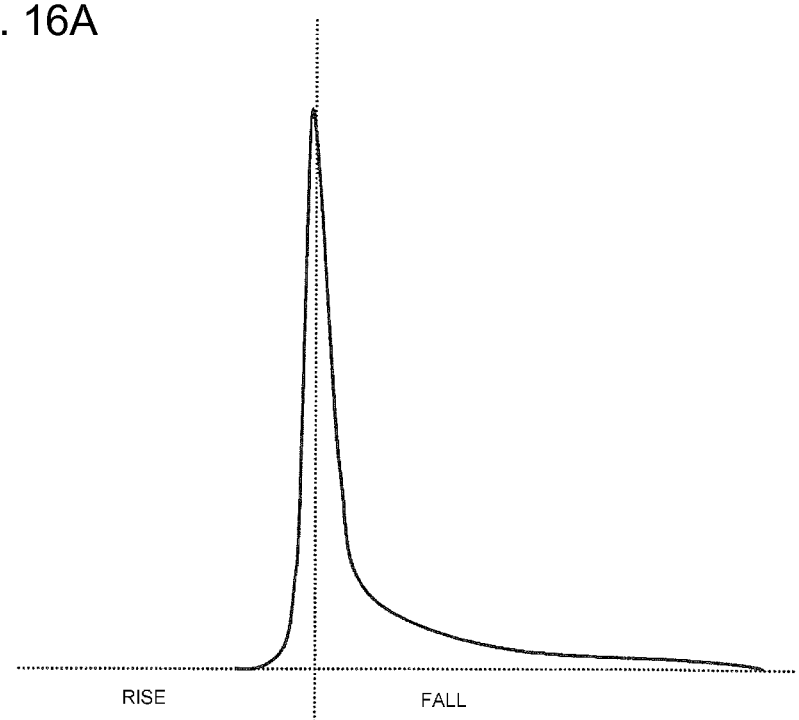
FIGS. 16A and 16B are explanatory drawings illustrating the waveform shaping.

The shaping principle is next explained. First, the case in which no shaping is performed will be explained. In the linear pulse signal in the case where no shaping is performed, the peak vicinity is steep as shown in FIG. 16A and the accurate peak value detection or separation from noise is difficult. Accordingly the detection of peak value and separation from noise are facilitated by relaxing the waveform slope. The waveform analysis is facilitated by highlighting the specific features of the pulse waveform.

The waveform shaping unit 8 shapes the linear pulse signal into a linear pulse signal having a smooth slope (a) and outputs the shaped linear pulse signal (a'). The high-speed AD conversion unit 2 performs AD conversion of the linear pulse signal (a') and generates digital pulse data (b).

Figure 15:
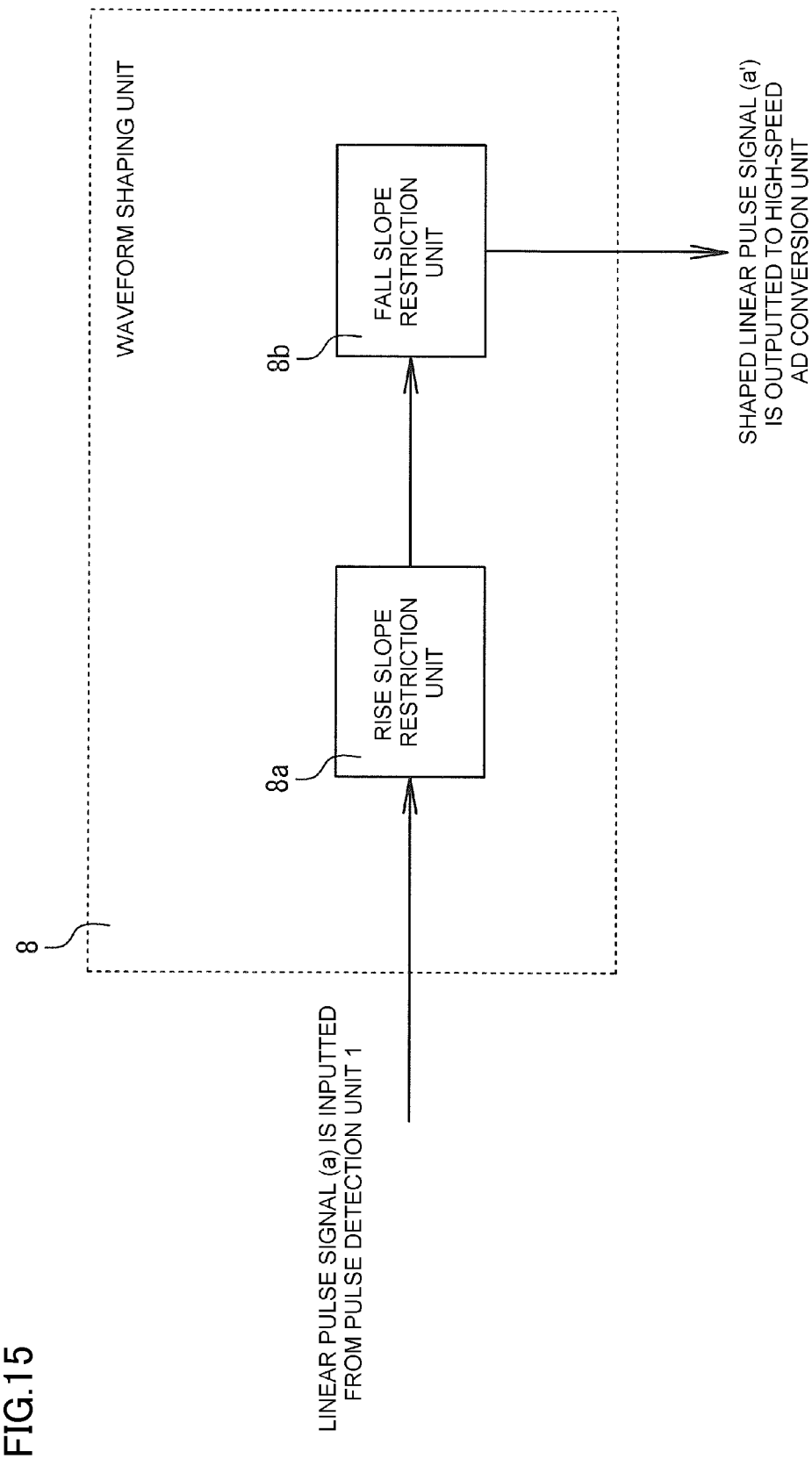
FIG. 15 is a block diagram of a waveform shaping unit.

More specifically, as shown in FIG. 15, the waveform shaping unit 8 is provided with a rise slope restriction unit 8a and a fall slope restriction unit 8b.

Figure 16B:
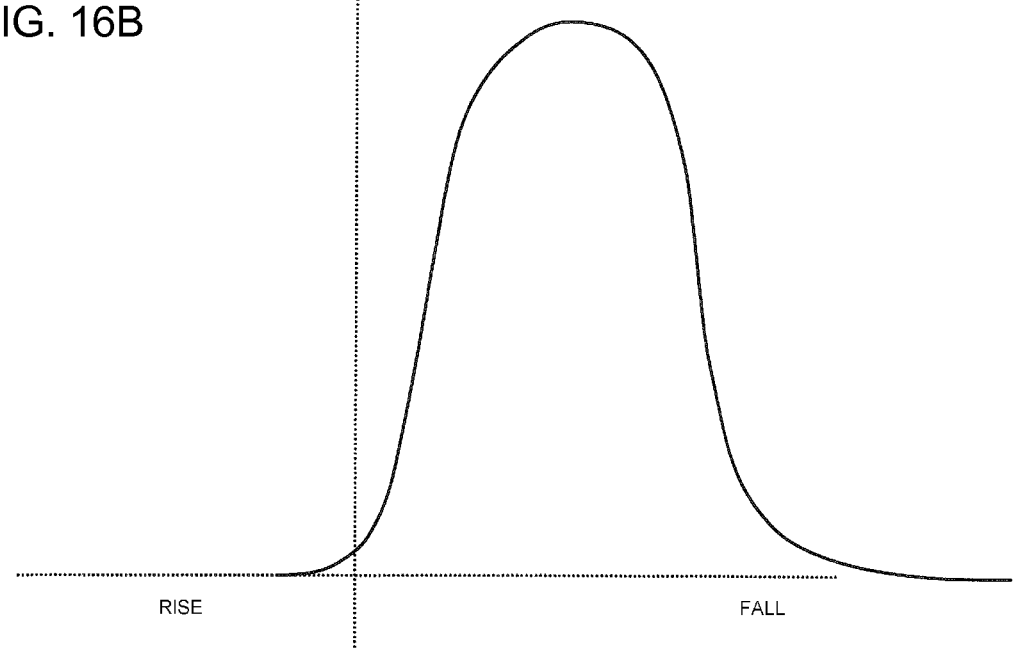

The rise slope restriction unit 8a shapes the smooth rise slope of the linear pulse signal (a). The rise slope restriction unit 8a is a filter, and the waveform slope is restricted by a time constant of CR. Therefore, as shown in FIG. 16A, the rise slope restriction unit 8a shapes the linear pulse signal with a steep rise into a waveform in which only the rise is smooth, as shown in FIG. 16B.

The fall slope restriction unit 8b shapes the smooth rise slope of the linear pulse signal (a). The fall slope restriction unit 8b is a filter, and the waveform slope is restricted by a time constant of CR. Therefore, as shown in FIG. 16A, the fall slope restriction unit 8b shapes the linear pulse signal with a steep fall into a waveform in which only the fall is smooth, as shown in FIG. 16B.

As a result, the waveform shaping unit 8 outputs pulses in which both the fall and rise are smooth and which are similar figures with respect to the wave height value.

The configuration of the fourth embodiment of the present invention additionally includes a waveform shaping unit 8 restricting the transient inclination in the linear pulse signal (a) outputted from a pulse detection unit 1. The waveform shaping unit 8 shapes the waveform to highlight the specific features of the pulse waveform and then performs the AD conversion. As a result, the accuracy of peak value detection can be increased. Further, since the specific features of the normal waveform are emphasized by the waveform shaping, it is easier to discriminate between the normal pulse and abnormal pulse in the pulse waveform analysis.

Figure 17:
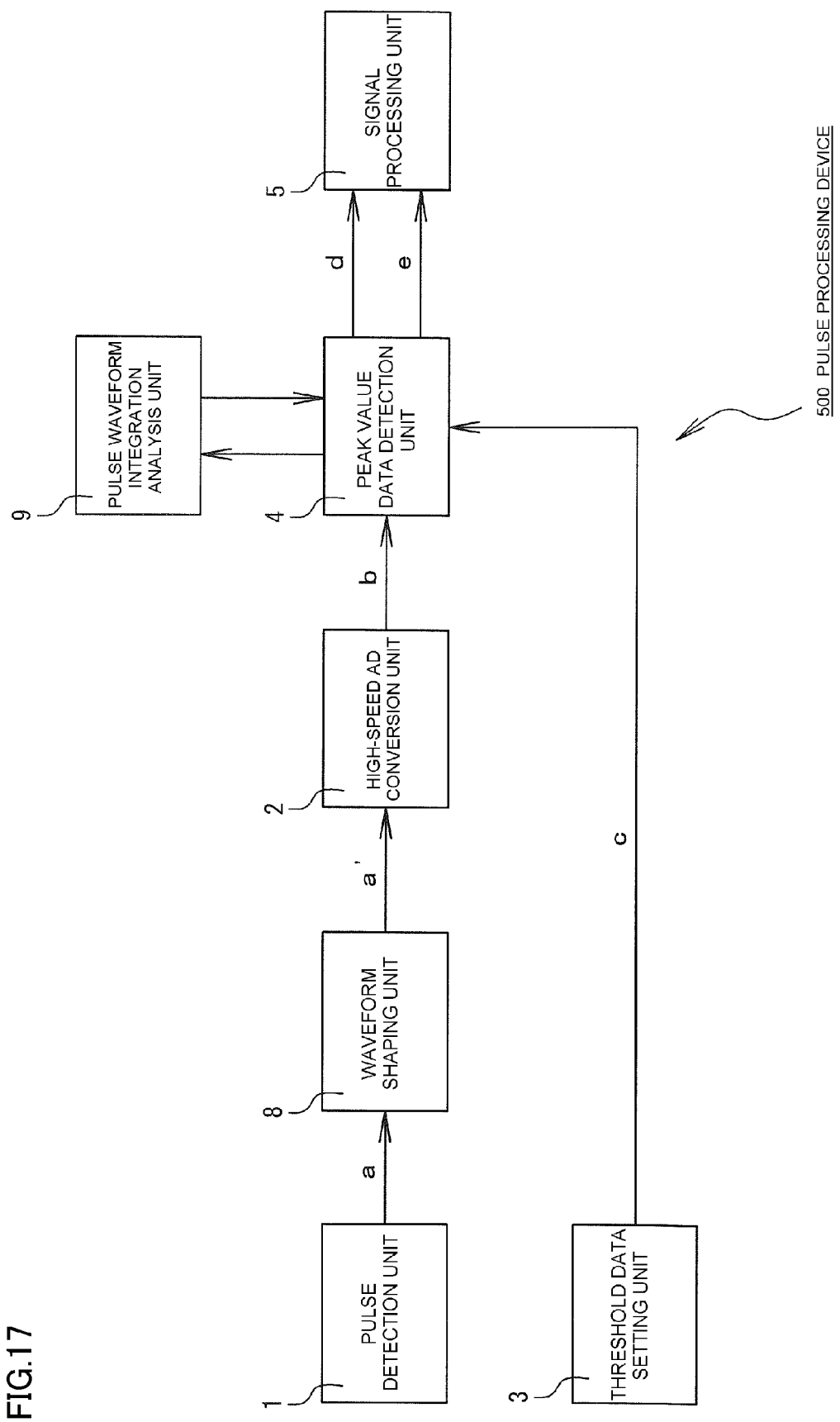
FIG. 17 is a block diagram of the pulse processing device of the fifth embodiment of the present invention.

The fifth embodiment for implementing the present invention will be explained now with reference to the appended drawings. As shown in FIG. 17, a pulse processing device 500 includes a pulse detection unit 1, a high-speed AD conversion unit 2, a threshold data setting unit 3, a peak value data detection unit 4, a signal processing unit 5, a waveform shaping unit 8, and a pulse waveform integration analysis unit 9.

Comparing with the preceding fourth embodiment, the difference is that the pulse waveform integration analysis unit 9 is connected to the peak value data detection unit 4 and the pulse waveform is integrated using the digital pulse data (b) from the peak value data detection unit 4 and then analyzed. The pulse detection unit 1, high-speed AD conversion unit 2, threshold data setting unit 3, peak value data detection unit 4, signal processing unit 5, and waveform shaping unit 8 are configured in the same manner as described above and assigned with the same reference numerals. The redundant explanation thereof is herein omitted. The explanation herein is focused on the pulse waveform integration analysis unit 9.

The pulse waveform integration analysis unit 9 calculates the integrated value of the pulse by using the digital pulse data from the peak value data detection unit 4, uses the integrated value to determine whether a preset condition is fulfilled, and controls the peak value data detection unit 4 so as to output peak value data relating to a pulse that fulfills the condition and discard other peak value data.

Figure 18:
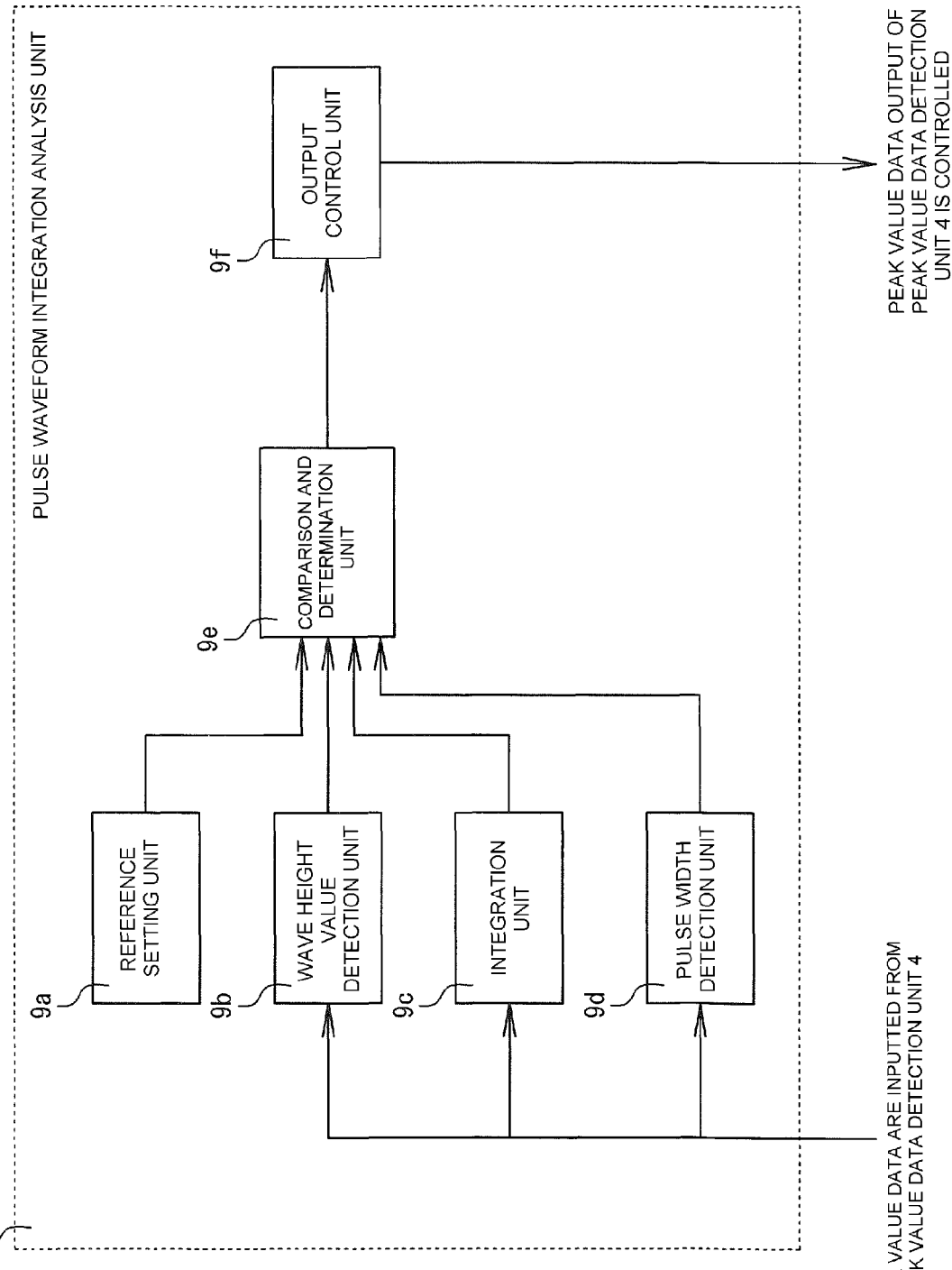
FIG. 18 is a block diagram of a pulse waveform integration analysis unit.

The pulse waveform integration analysis unit 9 is further provided, as shown in FIG. 18, with a reference setting unit 9a, a wave height value detection unit 9b, an integration unit 9c, a pulse width detection unit 9d, a comparison and determination unit 9e, and an output control unit 9f. Those units perform the below-described processing.

Figure 19A:
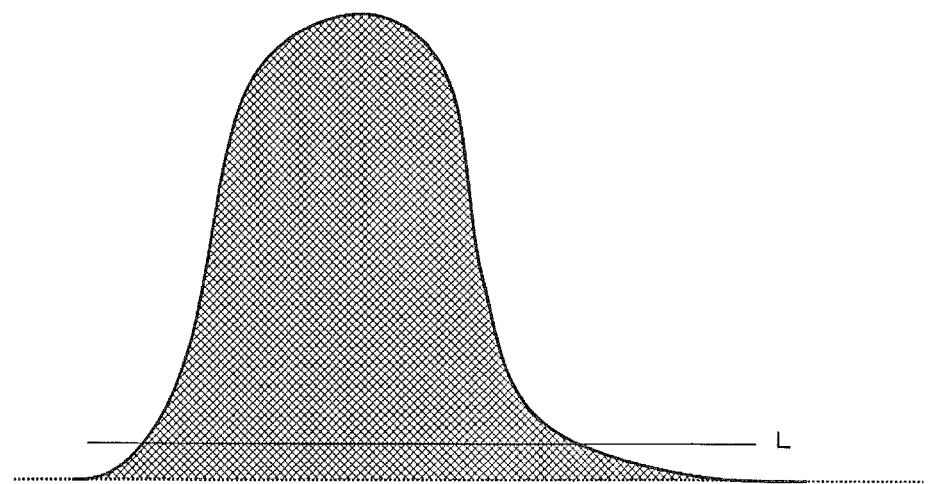
FIGS. 19A-19C are explanatory drawings illustrating the pulse waveform integration analysis.
Figure 19B:
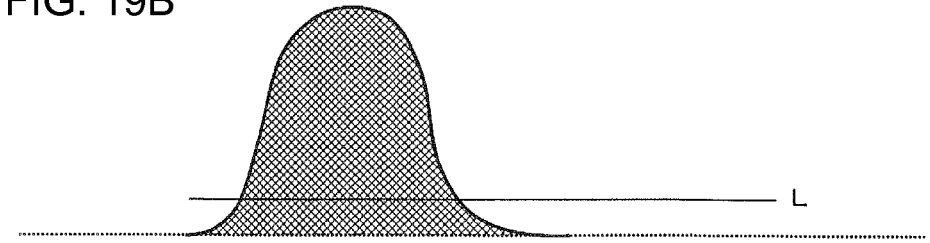
Figure 19C:
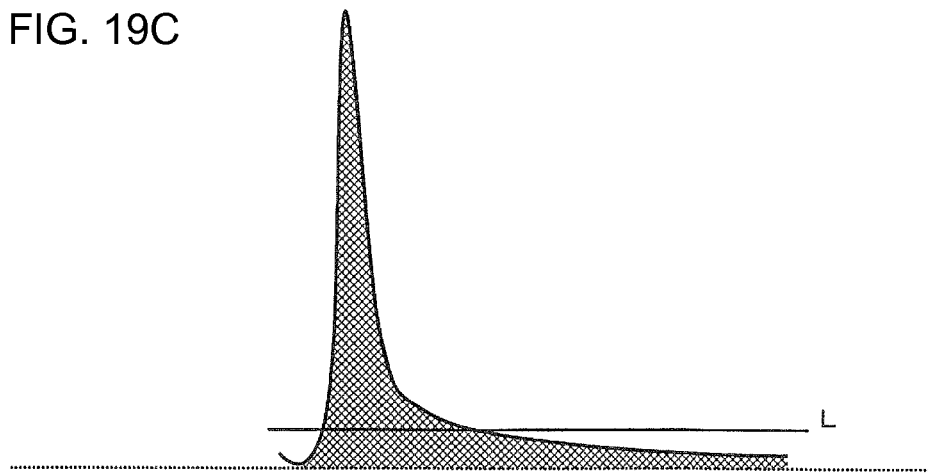

The principle of pulse waveform integration analysis will be explained initially. Where the pulse waveforms are similar figures, the pulse surface area is proportional to the second power of the wave height value. The reference ratio obtained by dividing the second power of the wave height value by the surface area relating to the predetermined standard pulse such as shown in FIG. 19A is registered, and when a pulse such as shown in FIG. is inputted, the surface area or wave height value relating to this pulse is calculated, and the ratio obtained by dividing the second power of the wave height value by the surface area is calculated for this pulse. Where this ratio is substantially equal to the reference ratio, it is determined that the proportional relationship is valid and that the pulse is normal. Where the surface area is abnormally small in relation to the wave height value and the ratio is different from the reference ratio when a certain pulse such as shown in 19C is inputted, the pulse is determined as noise and is removed.

In the first pulse waveform integration analysis, whether the abovementioned pulse is normal or abnormal is determined on the basis of the pulse waveform integration analysis principle.

As shown in FIG. 18, the reference setting unit 9a sets the upper limit value and lower limit value of the preset ratio. This ratio is a value obtained by dividing the second power of the wave height value by the surface area for one pulse serving as a reference.

The wave height value detection unit 9b inputs the digital pulse data and detects the maximum value of the digital pulse data relating to one pulse as the wave height value.

The integration unit 9c inputs the digital pulse data and calculates an integration value by adding the digital pulse data for one pulse.

The comparison and determination unit 9e determines that the pulse is normal when a condition that a ratio of a value obtained by taking a second power of the wave height value outputted from the wave height value detection unit 9b and the integration value outputted from the integration unit 9c is greater than the lower limit value and lower than the upper limit value outputted from the reference setting unit 9a is fulfilled. The comparison and determination unit 9e instead determines that the pulse is abnormal when the condition is not fulfilled.

This ratio is, for example, a value obtained by dividing a value obtaining by taking a second power of the wave height value outputted from the wave height value detection unit 9b by the integration value outputted from the integration unit 9c.

The output control unit 9f controls the peak value data detection unit 4 so that when the pulse is normal, the peak value data of the pulse are outputted, and when the pulse is abnormal, the peak value data of the pulse are discarded.

By performing such waveform analysis, it is possible to cancel spiry noise with a narrow width and trapezoidal noise with a large width.

The second pulse waveform integration analysis will be described next. In this analysis, the case in which the pulse surface area is not proportional to the second power of wave height value, in particular, the case in which the surface area is large, is also examined in detail in addition to the above-described first pulse waveform integration analysis. The case in which the pulse surface area is not proportional to the second power of wave height value and the surface area is large is further evaluated below.

Figure 20A:
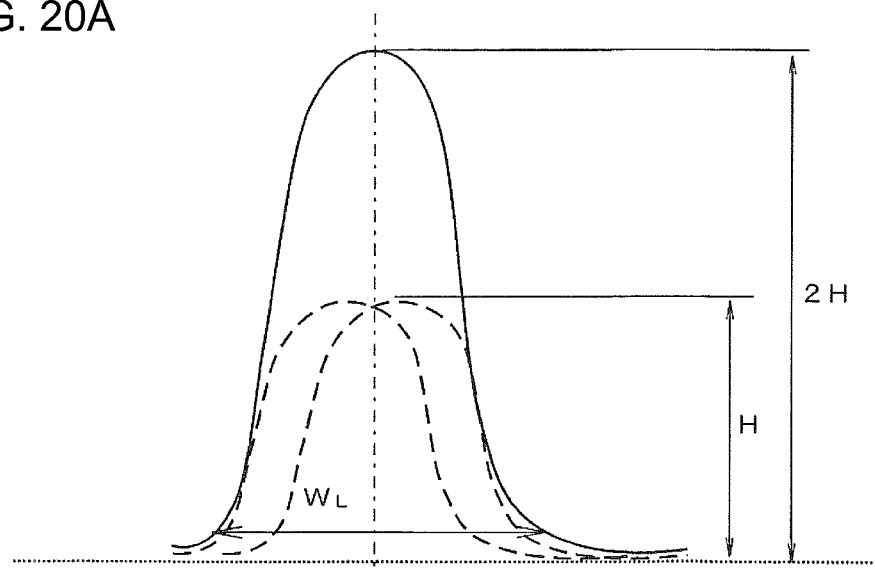
FIGS. 20A-20C are explanatory drawings illustrating the pulse waveform integration analysis.

When the wave height value H of the inputted pulse is about twice as large, but the pulse width $W_L$ is about the same, as shown in FIG. 20A, it is determined that two pulses have been inputted simultaneously and overlapped.

Figure 20B:
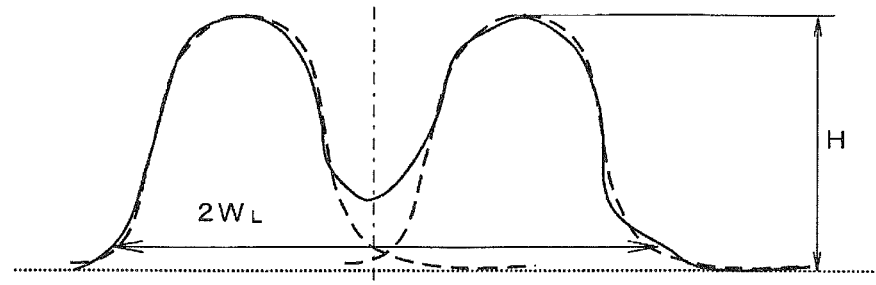

When the wave height value H of the inputted pulse is equal to that of the original pulse and the pulse width $W_L$ is about twice as large, as shown in FIG. 20B, it is determined that two pulses only partially overlap.

Figure 20C:
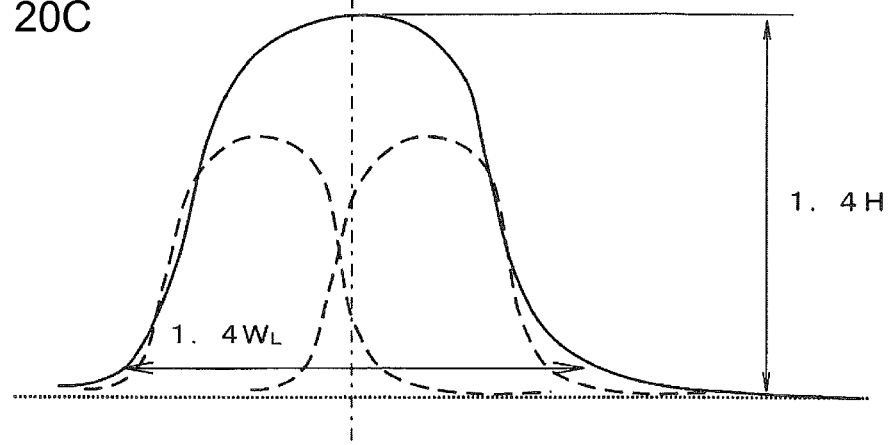

When the wave height value H of the inputted pulse is greater by a factor of about 1.4 and the pulse width $W_L$ is also greater by a factor of about 1.4, as shown in FIG. 20C, the two pulses slightly overlap and one pulse cannot be distinguished from the other. Therefore, the pulses are discarded or handled as a single pulse.

Since the very last case is encountered very rarely, the accuracy is not affected even if such processing is performed.

The processing performed in each unit will be described below.

The reference setting unit 9a sets the upper limit value and lower limit value of a preset ratio, and sets a reference wave height value and a reference pulse width for one pulse. The ratio is a value obtained by dividing the second power of the wave height value by the surface area for one pulse serving as a reference.

The wave height value detection unit 9b inputs the digital pulse data and determines the maximum value of the digital pulse data relating to one pulse as a wave height value.

The integration unit 9c inputs the digital pulse data and calculates an integration value by adding up the digital pulse data for one pulse.

The pulse width detection unit 9d inputs the digital pulse data and detects the number of digital pulse data exceeding a predetermined lower limit value for one pulse as a pulse width.

The comparison and determination unit 9e determines that the pulse is normal when a condition that a ratio of a value obtained by taking a second power of the wave height value outputted from the pulse width detection unit 9d and the integration value outputted from the integration unit 9c is greater than the lower limit value and lower than the upper limit value outputted from the reference setting unit 9a is fulfilled. The comparison and determination unit 9e also determines that the pulse is abnormal when the ratio is equal to or less than the lower limit value. The comparison and determination unit 9e determines that two pulses overlap when the ratio is greater than the upper limit value, the wave height value is about two times the reference wave height value, and the pulse width is about one times the reference pulse width. The comparison and determination unit 9e also determines that two pulses overlap when the ratio is greater than the upper limit value, the wave height value is about one times the reference wave height value, and the pulse width is about two times the reference pulse width.

The ratio is, for example, a value obtained by dividing the second power of the wave height value outputted from the wave height value detection unit 9b by the integration value outputted from the integration unit 9c.

The output control unit 9f controls the peak value data detection unit 4 so that when the pulse is normal, the peak value data of the pulse are outputted, when the pulses overlap, two peak value data are outputted, and when the pulse is abnormal, the peak value data of the pulse are discarded.

In the above-described fifth embodiment, the adverse effect produced by the high-frequency noise or shift of the sampling timing, which causes problems in the peak value data detection unit 4, can be reduced and more accurate wave height analysis can be performed. In particular, more accurate wave height analysis can be performed because the waveform shaping unit 8 shapes the waveforms of pulses to obtain similar figures and the integration unit 9c of the pulse waveform integration analysis unit 9 obtains the surface area of the pulses. Superimposed pulses can be also detected.

In the above-described first to fifth embodiments, the case is explained in which the peak detection signal (d) and peak value data (e) are outputted to the signal processing unit 5 when the digital pulse data are below the threshold data in the peak value data detection unit 4. However, the present invention is not limited to such configuration and it is also possible to output at least the peak value data (e) for a short time when the digital pulse data are below the threshold data and output the peak value data sporadically each time the digital pulse data are below the threshold data, instead of outputting the peak value data (e) continuously from the peak value data detection unit 4. In this case, in the signal processing unit 5, it is determined whether or not the peak value data (e) have been inputted, and the processing may be started and the peak detection signal can be omitted when the peak value data (e) are inputted. Further, it is also possible to output the peak value data (e) continuously in the peak value data detection unit 4, detect the variations in the peak value data (e) inputted by the signal processing unit (5) and start the processing when the peak value has changed. In this case, the peak detection signal can be also omitted.

EXAMPLE 1

Example 1 in which the first embodiment of the present invention is used for radiation detection will be explained below. In this example, the pulse processing device in accordance with the present invention is used in a radiation measuring instrument.

As shown in FIG. 21, a radiation measuring instrument 100' is provided with a radiation detector 10, a high-speed ADC 20, a CPU-including FPGA 30, and a control device 40. The CPU-including FPGA 30 is further provided with a threshold control circuit 31, a peak value detection circuit 32, a wave height analysis circuit 33, a wave height distribution memory 34, a CPU 35 as a computational processing unit, and a communication control circuit 36.

Figure 22A:
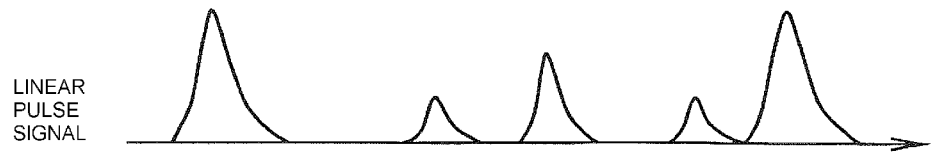
FIGS. 22A and 22B are explanatory drawings of signals.

The radiation detector 10 has a function same as that of the pulse detection unit 1 explained hereinabove and specializes on detecting radiation. The radiation is not a periodic signal. As shown in FIG. 22A, in the radiation detector 10, pulses having various wave height values are inputted at random timings.

The high-speed ADC 20 has a function same as that of the high-speed AD conversion unit 2 explained hereinabove. In particular, a high-speed and high-resolution (100 Msps and 14 bit) device is used to enable radiation detection.

The CPU-including FPGA 30 is a device capable of high-speed processing and the threshold control circuit 31, peak value detection circuit 32, and wave height analysis circuit 33 are realized by a FPGA-based logical circuit. In the CPU-including FPGA 30, the wave height analysis circuit 33 is controlled by the CPU 35, the threshold for the threshold control circuit 31 is set by the CPU 35, and communication with the external control device 40 is performed from the CPU 35 via the communication control circuit 36.

The threshold control circuit 31 has a function same as that of the threshold data setting unit 3 explained hereinabove and sets in advance the threshold such as described above. The setting is, for example, inputted to the control device 40, the control device 40 writes the setting to the CPU 35 via the communication control circuit 36, and the CPU 35 sets the setting in the threshold control circuit 31.

The peak value detection circuit 32 has a function same as that of the peak value data detection unit 4 explained hereinabove and performs the processing of detecting the peak value such as described above.

The wave height analysis circuit 33 has a function same as that of the signal processing unit 5 explained hereinabove. More specifically, this circuit is a SCA (single channel analyzer) or a MCA (multi-channel analyzer). The wave height analysis circuit 33 counts the number of pulses for each wave height value.

The wave height distribution memory 34 writes the number of pulses for each wave height value that is outputted from the wave height analysis circuit 33. Since the writing is performed directly from the wave height analysis circuit 33 to the wave height distribution memory 34, situations in which the CPU 35 interposes the processing for each pulse are eliminated and the processing standby time is greatly reduced.

The CPU 35 reads the number of pulses for each wave height value from the wave height distribution memory 34 and generates wave height distribution data. The CPU 35 transmits the wave height distribution data to the communication control circuit 36.

The communication control circuit 36 converts the wave height distribution data into communication data and outputs the communication data.

Figure 22B:
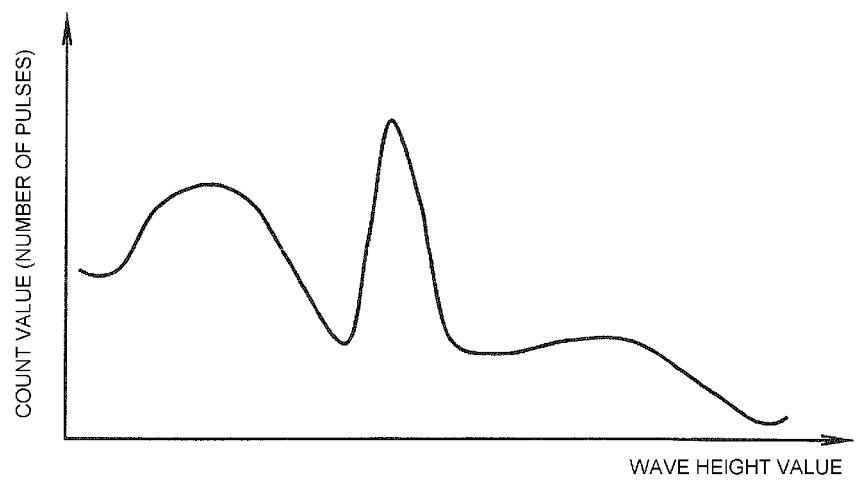

The control device 40 is, for example, the usual personal computer which returns the communication data to the wave height distribution data to display on a screen. The distribution data in which the numbers of pulses for each wave height value have been accumulated, as shown in FIG. 22B, are displayed. In the communication control circuit 36 and the control device 40, the output units in accordance with the present invention are configured. The radiation measuring instrument 100' is thus configured.

In such radiation measuring instrument 100', the circuits can operate in parallel as explained hereinabove. Since the CPU 35 is not required to perform the processing in input pulse units and the processing is performed in the logical circuit of the FPGA until the data are written into the wave height distribution memory 34, high-speed operations can be performed.

EXAMPLE 2

Example 2 in which the second embodiment of the present invention is used for radiation detection will be explained below.

Figure 23:
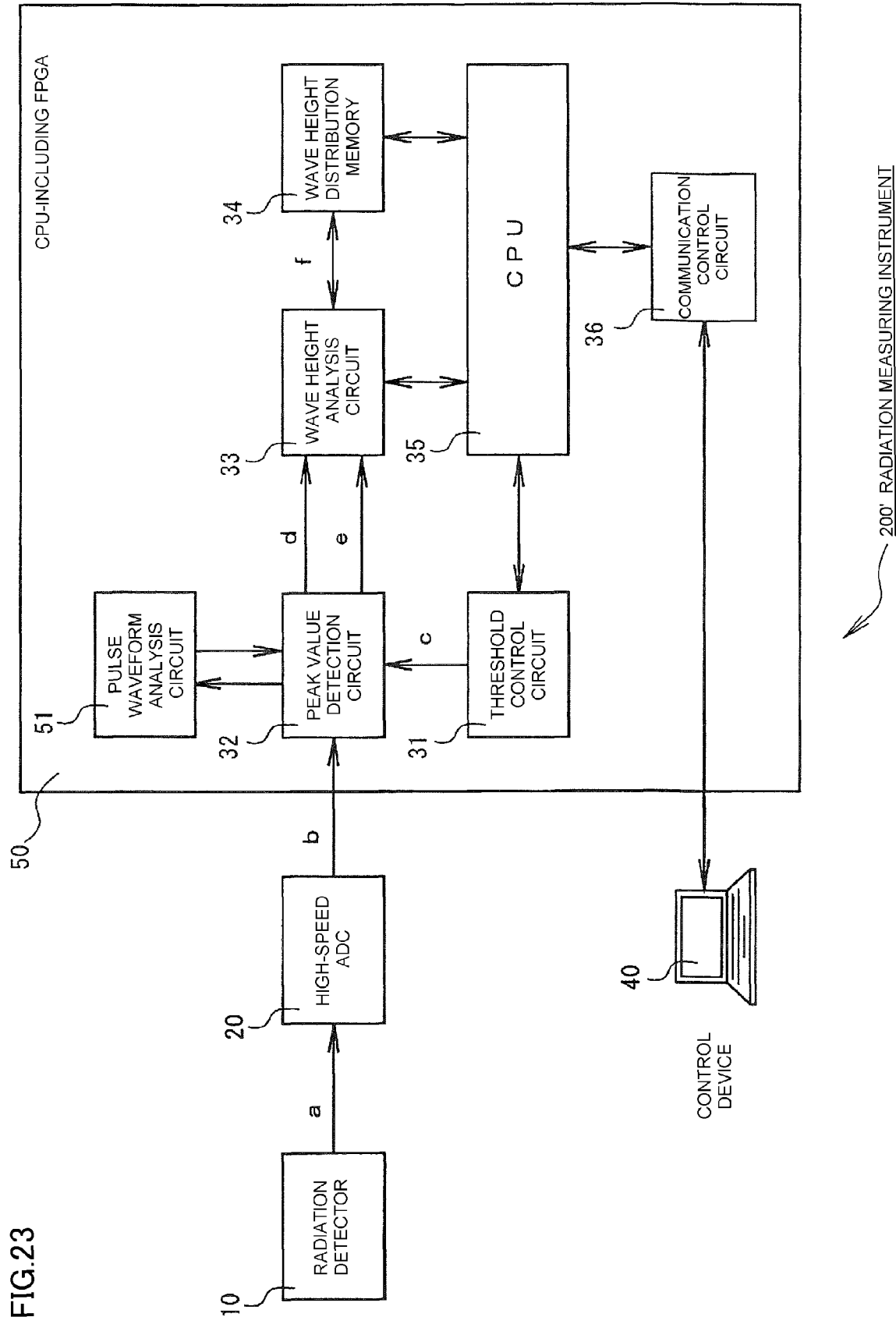
FIG. 23 is a block diagram of the radiation measuring instrument of Embodiment 2.

As shown in FIG. 23, a radiation measuring instrument 200' is provided with a radiation detector 10, a high-speed ADC 20, a CPU-including FPGA 50, and a control device 40. The CPU-including FPGA 50 is further provided with a threshold control circuit 31, a peak value detection circuit 32, a wave height analysis circuit 33, a wave height distribution memory 34, a CPU 35 as a computational processing unit, a communication control circuit 36, and a pulse waveform analysis circuit 51.

Comparing Example 2 with the above-described Example 1, the difference therebetween is particularly in the CPU-including FPGA 50, and this difference is only in that the pulse waveform analysis circuit 51 is added.

The pulse waveform analysis circuit 51 has a function same as that of the pulse waveform analysis unit 6 explained hereinabove and this function is realized by the logical circuit of the FPGA. Therefore, high-speed operations can be performed. In Example 2, it is possible to obtain the radiation measuring instrument 200' in which noise is removed and detection accuracy is increased in the same manner as in the above-described second embodiment.

EXAMPLE 3

Example 3 in which the third embodiment of the present invention is used for radiation detection will be explained below.

Figure 24:
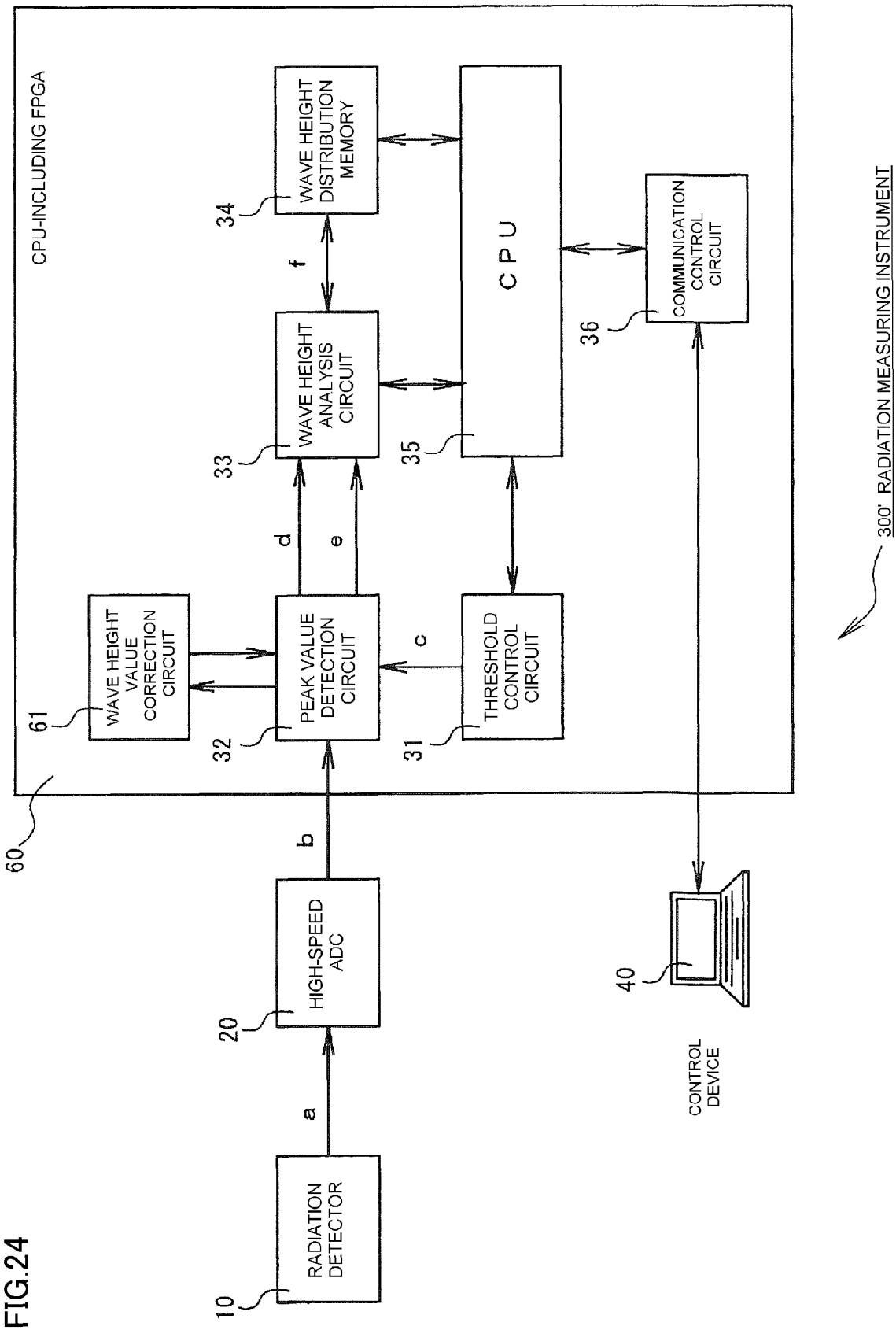
FIG. 24 is a block diagram of the radiation measuring instrument of Embodiment 3.

As shown in FIG. 24, a radiation measuring instrument 300' is provided with a radiation detector 10, a high-speed ADC 20, a CPU-including FPGA 60, and a control device 40. The CPU-including FPGA 60 is further provided with a threshold control circuit 31, a peak value detection circuit 32, a wave height analysis circuit 33, a wave height distribution memory 34, a CPU 35 as a computational processing unit, a communication control circuit 36, and a wave height value correction circuit 61.

Comparing Example 3 with the above-described Example 1, the difference therebetween is particularly in the CPU-including FPGA 60, and this difference is only in that the wave height value correction circuit 61 is added.

The wave height value correction circuit 61 has a function same as that of the wave height value correction unit 7 explained hereinabove and this function is realized by the logical circuit of the FPGA. Therefore, high-speed operations can be performed. In Example 3, it is possible to obtain the radiation measuring instrument 300' in which noise is removed and detection accuracy is increased in the same manner as in the above-described third embodiment.

EXAMPLE 4

Example 4 in which the fourth embodiment of the present invention is used for radiation detection will be explained below.

Figure 25:
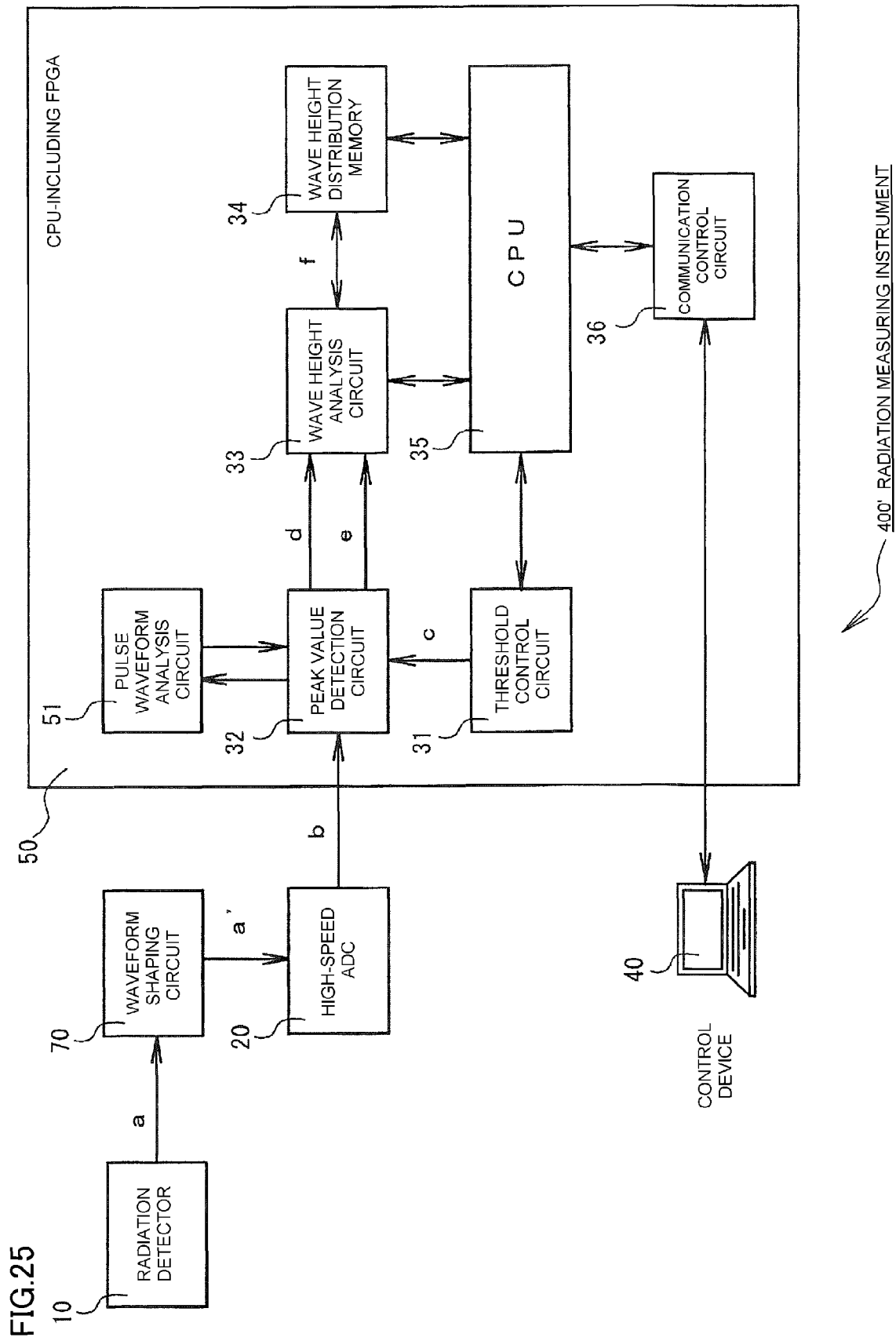
FIG. 25 is a block diagram of the radiation measuring instrument of Embodiment 4.

As shown in FIG. 25, a radiation measuring instrument 400' is provided with a radiation detector 10, a high-speed ADC 20, a CPU-including FPGA 50, a control device 40, and a waveform shaping circuit 70. The CPU-including FPGA 50 is further provided with a threshold control circuit 31, a peak value detection circuit 32, a wave height analysis circuit 33, a wave height distribution memory 34, a CPU 35 as a computational processing unit, a communication control circuit 36, and a pulse waveform analysis circuit 51.

Comparing Example 4 with the above-described Example 2, the difference therebetween is that the waveform shaping circuit 70 is added.

The waveform shaping circuit 70 has a function same as that of the waveform shaping unit 8 explained hereinabove. In Example 4, it is possible to obtain the radiation measuring instrument 400' in which noise is removed and detection accuracy is increased in the same manner as in the above-described fourth embodiment.

EXAMPLE 5

Example 5 in which the fifth embodiment of the present invention is used for radiation detection will be explained below.

Figure 26:
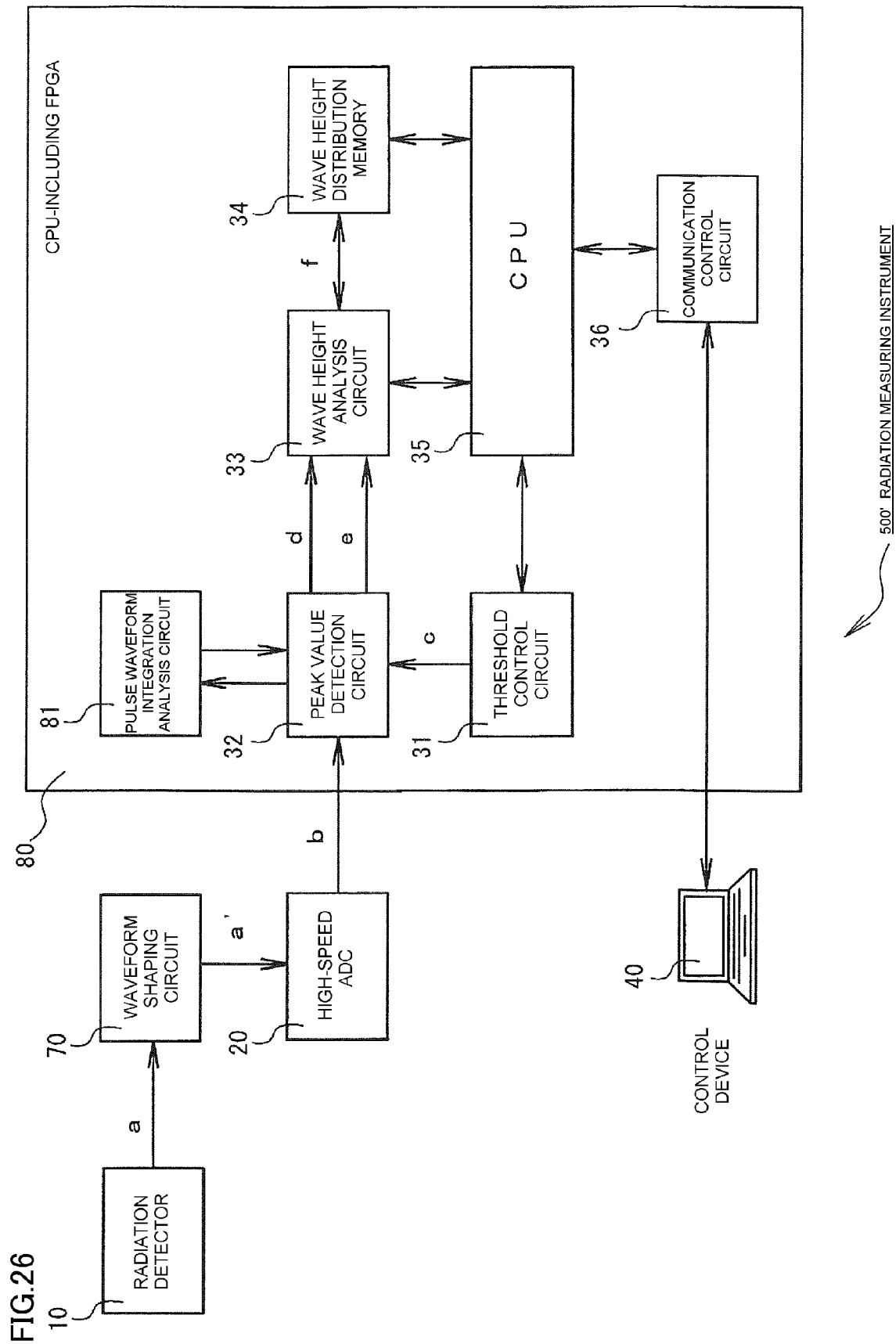
FIG. 26 is a block diagram of the radiation measuring instrument of Embodiment 5.

As shown in FIG. 26, a radiation measuring instrument 500' is provided with a radiation detector 10, a high-speed ADC 20, a CPU-including FPGA 80, a control device 40, and a waveform shaping circuit 70. The CPU-including FPGA 80 is further provided with a threshold control circuit 31, a peak value detection circuit 32, a wave height analysis circuit 33, a wave height distribution memory 34, a CPU 35 as a computational processing unit, a communication control circuit 36, and a pulse waveform integration analysis circuit 81.

Comparing Example 5 with the above-described Example 4, the difference therebetween is particularly that the pulse waveform integration analysis circuit 81 is added.

The pulse waveform integration analysis circuit 81 also has a function same as that of the pulse waveform integration analysis unit 9 explained hereinabove. In Example 5, it is possible to obtain the radiation measuring instrument in which noise is removed and detection accuracy is increased in the same manner as in the above-described fifth embodiment.

The pulse processing device in accordance with the present invention is advantageously suitable for detecting one inputted pulse with high accuracy. The great merit of using such pulse processing device in a radiation measuring instrument is that a high-accuracy wave height distribution can be obtained and radiation nuclides can be reliably specified.

The invention claimed is:

1. A pulse processing device comprising:
a pulse detection unit that outputs a linear pulse signal in response to a physical event;
a waveform shaping unit that shapes the linear pulse signal into a linear pulse signal having a smooth slope;
a high-speed AD conversion unit that converts the shaped linear pulse signal into digital pulse data;
a threshold data setting unit that outputs preset threshold data;
a peak value data detection unit that compares the digital pulse data outputted by the high-speed AD conversion unit with the threshold data outputted by the threshold data setting unit, temporarily stores maximum digital pulse data, from among digital pulse data continuously exceeding the threshold data, as peak value data and outputs at least the maximum peak value data when the digital pulse data thereafter become less than the threshold data;
a pulse waveform integration analysis unit that calculates an integration value of a pulse by using the digital pulse data from the peak value data detection unit, uses the integrated value to determine whether a preset condition is fulfilled, and controls the peak value data detection unit so as to output peak value data relating to a pulse that fulfills the preset condition and discard other peak value data; and
a signal processing unit that inputs the peak value data, which are outputted from the peak value data detection unit; and
wherein the pulse waveform integration analysis unit comprises:
a reference setting unit that sets an upper limit value and a lower limit value at a preset ratio;
a wave height value detection unit that receives input of the digital pulse data and detects a maximum value of the digital pulse data relating to one pulse as a wave height value;
an integration unit that receives input of the digital pulse data and calculates an integration value by adding up the digital pulse data for one pulse;
a comparison and determination unit that determines that the pulse is normal when a condition that a ratio, which is obtained by dividing a value obtained by raising the wave height value outputted from the wave height value detection unit to the second power by the integration value outputted from the integration unit, is greater than the lower limit value outputted from the reference setting unit and lower than the upper limit value outputted from the reference setting unit is fulfilled, and determines that the pulse is abnormal when the condition is not fulfilled; and
an output control unit that controls the peak value data detection unit so that when the pulse is normal, the peak value data of the pulse are outputted, and when the pulse is abnormal, the peak value data of the pulse are discarded.

2. A radiation measuring device comprising:

the pulse processing device according to claim 1, which is a wave height analysis circuit in which the signal processing unit outputs wave height distribution data;

a wave height distribution memory that registers wave height distribution data from the wave height analysis circuit;

a computation processing unit that reads the wave height distribution data from the wave height distribution memory; and an output unit that displays a wave height distribution by using the wave height distribution data outputted from the computation processing unit.

3. A pulse processing device comprising:

a pulse detection unit that outputs a linear pulse signal in response to a physical event;

a waveform shaping unit that shapes the linear pulse signal into a linear pulse signal having a smooth slope;

a high-speed AD conversion unit that converts the shaped linear pulse signal into digital pulse data;

a threshold data setting unit that outputs preset threshold data;

a peak value data detection unit that compares the digital pulse data outputted by the high-speed AD conversion unit with the threshold data outputted by the threshold data setting unit, temporarily stores maximum digital pulse data, from among digital pulse data continuously exceeding the threshold data, as peak value data and outputs at least the maximum peak value data when the digital pulse data are thereafter less than the threshold data;

a pulse waveform analysis unit that calculates an integration value of a pulse by using the digital pulse data from the peak value data detection unit, uses the integrated value to determine whether a preset condition is fulfilled, and controls the peak value data detection unit so at to output peak value data relating to a pulse that fulfills the preset condition and discard other peak value data; and a signal processing unit that inputs the peak value data, which are outputted from the peak value data detection unit; and wherein the pulse waveform integration analysis unit comprises:

a reference setting unit that sets an upper limit value and a lower limit value at a preset ratio, and a reference wave height value and a reference pulse width for one pulse;

a wave height value detection unit that receives input of the digital pulse data and detects a maximum value of the digital pulse data relating to one pulse as a wave height value;

an integration unit that receives input of the digital pulse data and calculates an integration value by adding up the digital pulse data for one pulse;

a pulse width detection unit that receives input of the digital pulse data and detects the number of digital pulse data exceeding a predetermined lower limit value for one pulse as a pulse width;

a comparison and determination unit that determines that the pulse is normal when a condition that a ratio, which is obtained by dividing a value obtained by raising the wave height value outputted from the wave height value detection unit to the second power by the integration value outputted from the integration unit, is greater than the lower limit value outputted from the reference setting unit and lower than the upper limit value outputted from the reference setting unit is fulfilled, determines that the pulse is abnormal when the ratio is equal to or less than the lower limit value, determines that two pulses overlap when the ratio is greater than the upper limit value and the wave height value is two times the reference wave height value and moreover the pulse width is one times the reference pulse width, and also determines that two pulses overlap when the ratio is greater than the upper limit value and the wave height value is one times the reference wave height value and moreover the pulse width is two times the reference pulse width; and an output control unit that controls the peak value data detection unit so that when the pulse is normal, the peak value data of the pulse are outputted, when the pulses overlap, two peak value data are outputted, and when the pulse is abnormal, the peak value data of the pulse are discarded.

4. A radiation measuring device comprising:

the pulse processing device according to claim 3, which is a wave height analysis circuit in which the signal processing unit outputs wave height distribution data;

a wave height distribution memory that registers wave height distribution data from the wave height analysis circuit;

a computation processing unit that reads the wave height distribution data from the wave height distribution memory; and an output unit that displays a wave height distribution by using the wave height distribution data outputted from the computation processing unit.

5. A pulse processing device comprising:

a pulse detection unit that outputs a linear pulse signal in response to a physical event;

a waveform shaping unit that shapes the linear pulse signal into a linear pulse signal having a smooth slope;

a high-speed AD conversion unit that converts the shaped linear pulse signal into digital pulse data;

a threshold data setting unit that outputs preset threshold data;

a peak value data detection unit that receives the digital pulse data outputted by the high-speed AD conversion unit sequentially, compares the digital pulse data with the threshold data outputted by the threshold data setting unit, stores the digital pulse data exceeding the threshold data, as peak value data, updates, when the digital pulse data thereafter exceeds the stored peak value data, the stored peak value data with the digital pulse data larger than the stored peak value data and outputs at least the stored peak value data when the digital pulse data thereafter become less than the threshold data;

a pulse waveform integration analysis unit that calculates an integration value of a pulse by using the digital pulse data from the peak value data detection unit, uses the integrated value to determine whether a preset condition is fulfilled, and controls the peak value data detection unit so as to output peak value data relating to a pulse that fulfills the preset condition and discard other peak value data; and a signal processing unit that inputs the peak value data, which are outputted from the peak value data detection unit, wherein the pulse waveform integration analysis unit comprises:

a reference setting unit that sets an upper limit value and a lower limit value at a preset ratio;

a wave height value detection unit that receives input of the digital pulse data and detects a maximum value of the digital pulse data relating to one pulse as a wave height value;

an integration unit that receives input of the digital pulse data and calculates an integration value by adding up the digital pulse data for one pulse;

a comparison and determination unit that determines that the pulse is normal when a condition that a ratio which is obtained by dividing a value obtained by raising the wave height value outputted from the wave height value detection unit to the second power by the integration value outputted from the integration unit is greater than the lower limit value outputted from the reference setting unit and lower than the upper limit value outputted from the reference setting unit is fulfilled, and determines that the pulse is abnormal when the condition is not fulfilled; and an output control unit that controls the peak value data detection unit so that when the pulse is normal, the peak value data of the pulse are outputted, and when the pulse is abnormal, the peak value data of the pulse are discarded.

6. A radiation measuring device comprising:

the pulse processing device according to claim 5, which is a wave height analysis circuit in which the signal processing unit outputs wave height distribution data;

a wave height distribution memory that registers wave height distribution data from the wave height analysis circuit;

a computation processing unit that reads the wave height distribution data from the wave height distribution memory; and an output unit that displays a wave height distribution by using the wave height distribution data outputted from the computation processing unit.

* * * * *